United States Patent
Xu et al.

(10) Patent No.: US 12,520,617 B2
(45) Date of Patent: Jan. 6, 2026

(54) CANAL DYNAMIC PHOTODIODES

(71) Applicant: Maxim Integrated Products, Inc., San Jose, CA (US)

(72) Inventors: Chuan Xu, Portland, OR (US); Joy E. Jones, Milpitas, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 445 days.

(21) Appl. No.: 18/149,086

(22) Filed: Dec. 31, 2022

(65) Prior Publication Data
US 2024/0222531 A1    Jul. 4, 2024

(51) Int. Cl.
*H10F 77/20*      (2025.01)
*H10F 30/221*     (2025.01)

(52) U.S. Cl.
CPC ......... *H10F 77/206* (2025.01); *H10F 30/221* (2025.01)

(58) Field of Classification Search
CPC ........................... H10F 30/282; H10F 30/2823
See application file for complete search history.

(56) References Cited

U.S. PATENT DOCUMENTS

| | | | |
|---|---|---|---|
| 2011/0024791 A1 | 2/2011 | Schulze et al. | |
| 2012/0313155 A1* | 12/2012 | Okhonin | H10F 77/206 |
| | | | 257/E31.095 |
| 2018/0013013 A1 | 1/2018 | Mauder et al. | |
| 2018/0182844 A1 | 6/2018 | Nakamura | |

OTHER PUBLICATIONS

International Search Report and Written Opinion for International Application No. PCT/US2023/086230 mailed Apr. 18, 2024, 06 Pages.

* cited by examiner

*Primary Examiner* — Matthew L Reames
(74) *Attorney, Agent, or Firm* — DLA Piper LLP (US)

(57) ABSTRACT

A canal dynamic photodiode includes a gate structure forming a plurality of apertures, at least one anode region within the gate structure, and a plurality of cathode regions. Each cathode region of the plurality of cathode regions is within a respective aperture of the plurality of apertures. The canal dynamic photodiode may further include a plurality of field regions, where each cathode region of the plurality of cathode regions is separated from the gate structure by a respective field region of the plurality of field regions. Each field region optionally includes a respective doped surface region.

20 Claims, 19 Drawing Sheets

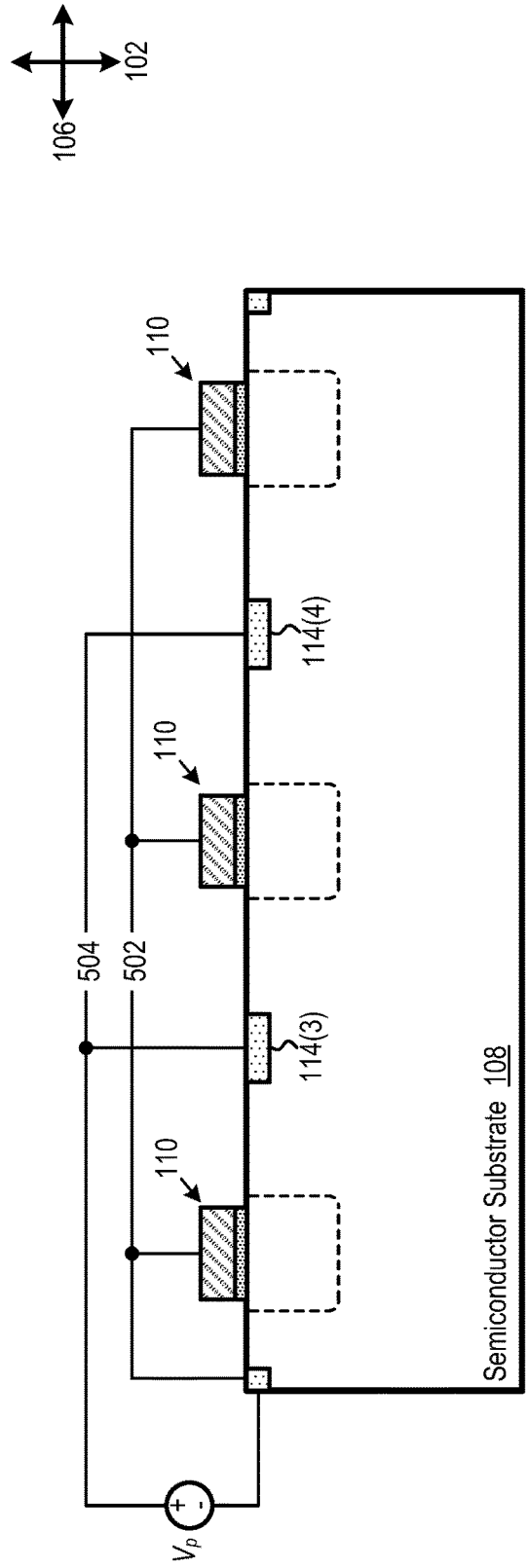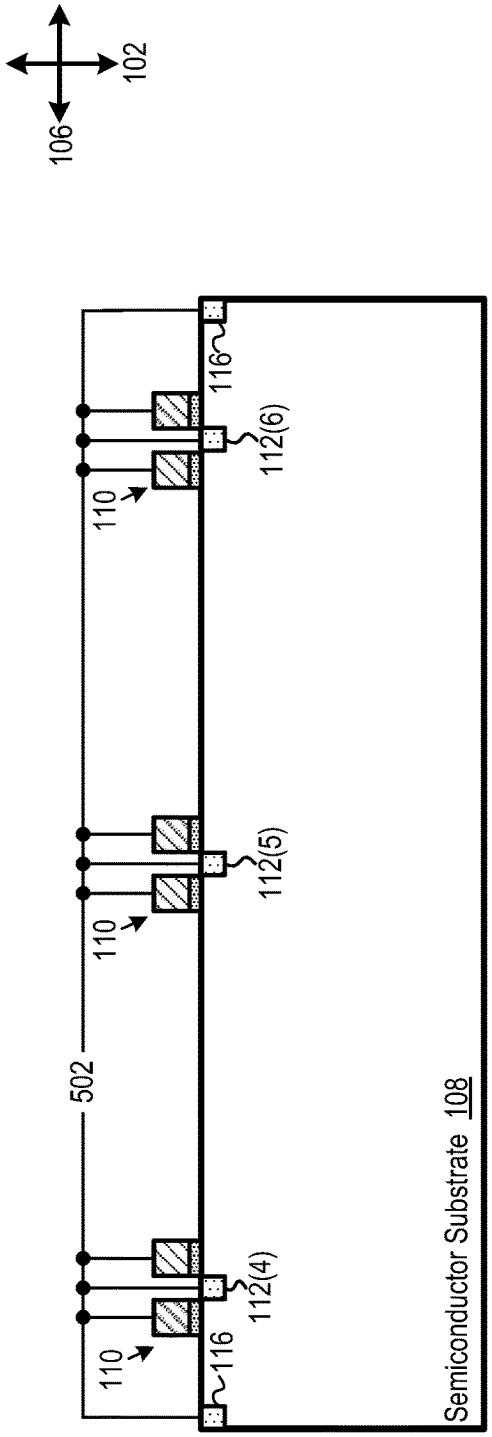
FIG. 5A
FIG. 5B

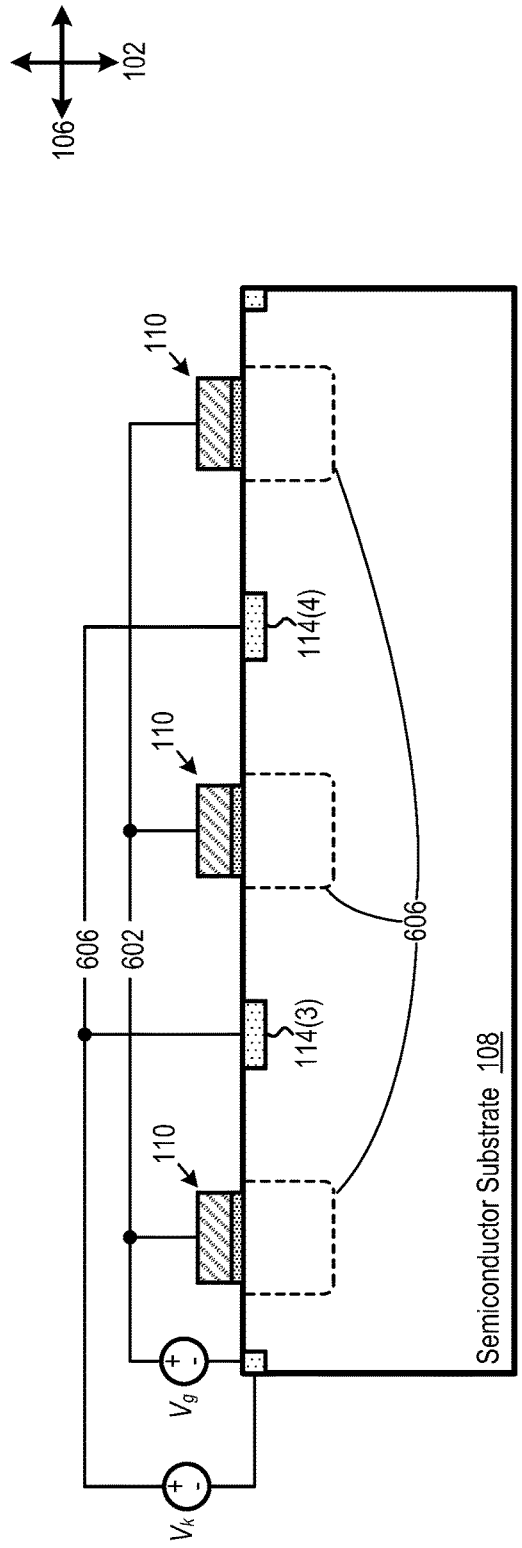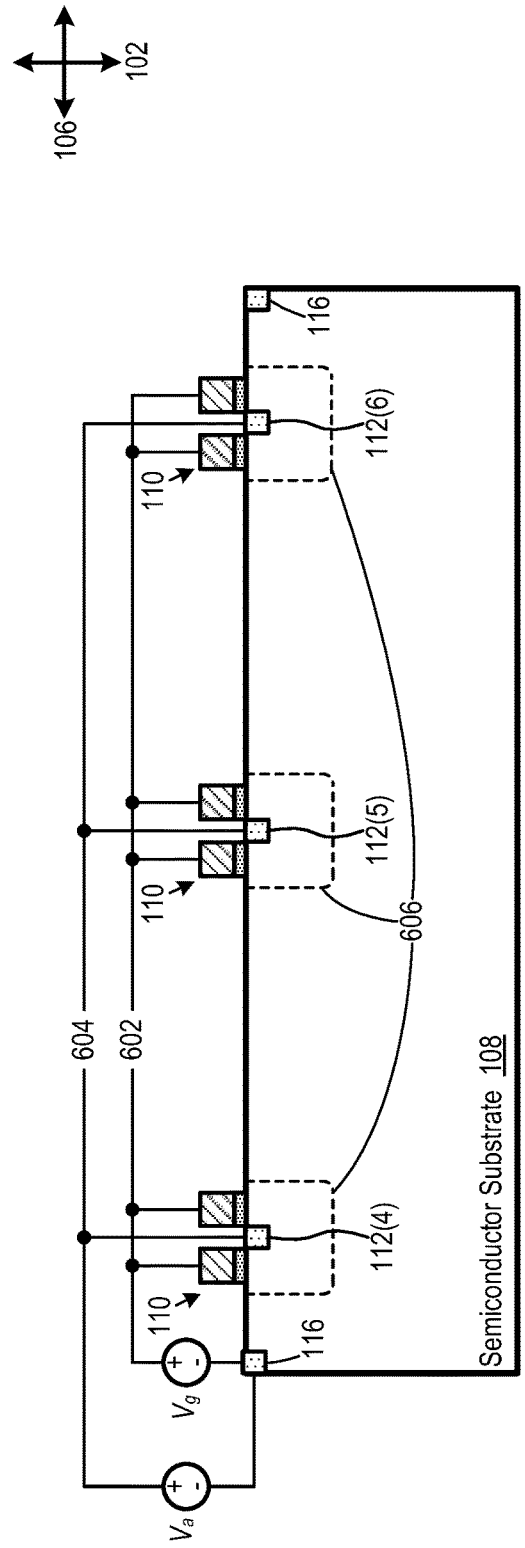
FIG. 6A
FIG. 6B

CANAL DYNAMIC PHOTODIODES

BACKGROUND

A photodiode is a device which generates an electric current in response to incident light. Photodiodes are used in a wide variety of applications. For example, photodiodes are commonly used in medical devices, such as in heart rate monitors and in oximeters. Additionally, photodiodes are frequently used in communication systems, such as to detect light transmitted through an optical cable. Furthermore, photodiodes are widely used in imaging devices, such as in digital cameras.

BRIEF DESCRIPTION OF THE DRAWINGS

FIGS. 5A and 5B are cross-sectional views of the FIG. 1 canal dynamic photodiode collectively illustrating one example of electrical biasing of the canal dynamic photodiode in a reset operating mode.

FIG. 6A and FIG. 6B are cross-sectional views of the FIG. 1 canal dynamic photodiode collectively illustrating one example of electrical biasing of the canal dynamic photodiode in a sensing operating mode.

DETAILED DESCRIPTION OF THE EMBODIMENTS

One class of photodiodes are dynamic photodiodes (DPDs), which rely on deep depletion of a metal oxide semiconductor capacitor (MOSCAP) to form a barrier between an anode region of the photodiode and the substrate of the photodiode. Incident light generates electron-hole pairs within the photodiode, which decreases the depth of a MOSCAP depletion region and increases magnitude of current flowing from the anode region to the substrate. A triggering time of a dynamic photodiode is a time required for magnitude of current flowing from the anode region to the substrate to reach a predetermined threshold value, and triggering time decreases with increasing incident light intensity. As such, incident light intensity may be determined from triggering time. Triggering time is also affected by wavelength of incident light.

It is generally desirable that a dynamic photodiode has a high sensitivity, or stated differently, that a dynamic photodiode has a short triggering time for a given intensity of incident light. Disclosed herein are canal dynamic photodiodes which significantly advance the state of the art of dynamic photodiodes. Certain embodiments of the canal dynamic photodiodes are configured so that electrons generated in response to incident light, henceforth referred to as photo electrons, need only travel a relatively small distance to accumulate under a gate structure, thereby enabling quick decrease in depth of a depletion region and associated short triggering time. Additionally, some embodiments are configured with engineered doping in field regions which helps prevent flow of photo electrons to cathode regions, thereby further promoting quick triggering time by reducing photo electrons lost to cathode regions. Consequently, the new canal dynamic photodiodes may have significantly higher sensitivity than conventional dynamic photodiodes.

Figure 1:
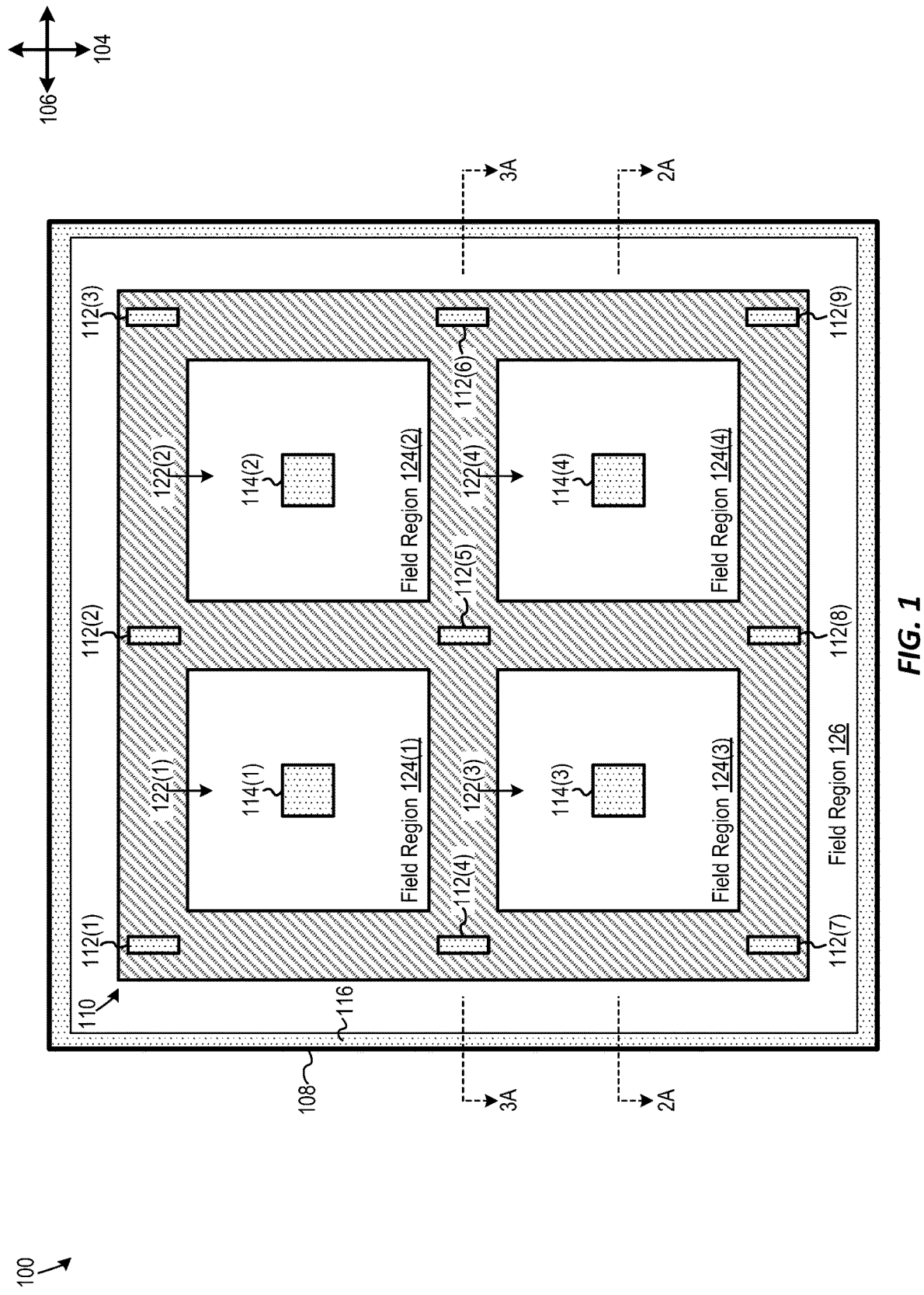
FIG. 1 is a top plan view of a canal dynamic photodiode, according to an embodiment.
Figure 2:
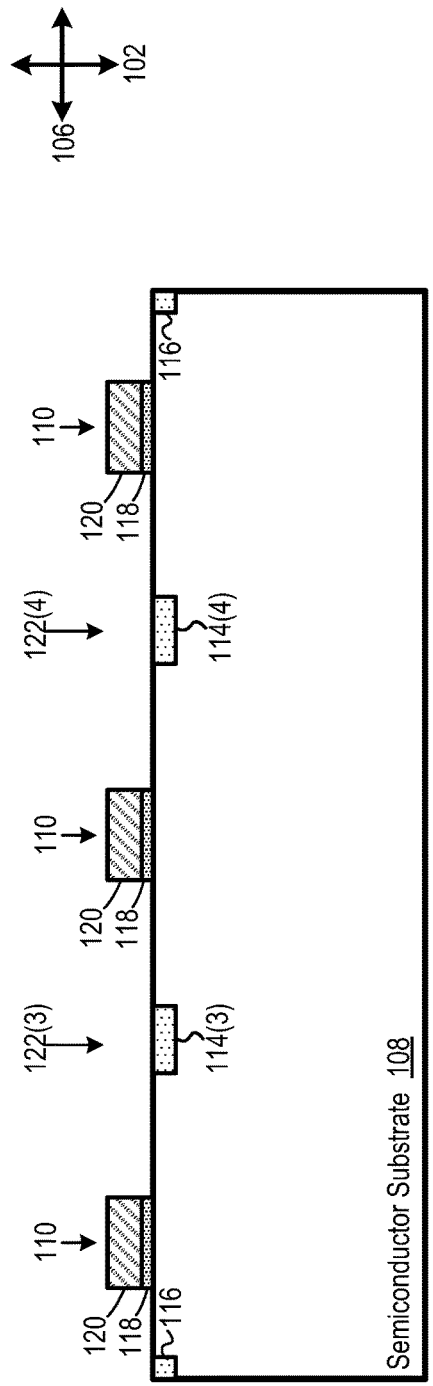
FIG. 2 is a cross-sectional view of the FIG. 1 canal dynamic photodiode.
Figure 3:
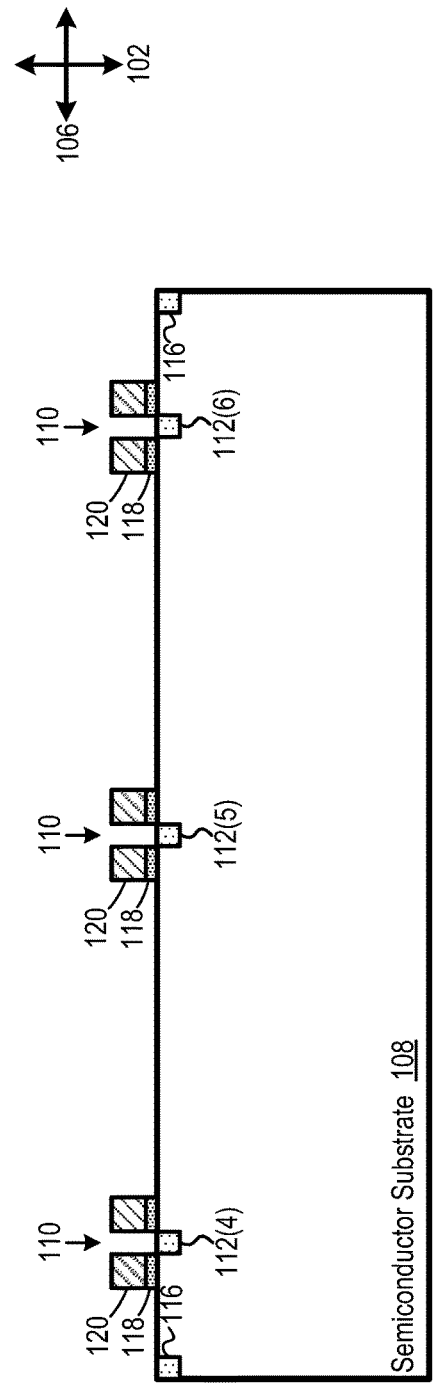
FIG. 3 is another cross-sectional view of the FIG. 1 canal dynamic photodiode.

FIG. 1 is a top plan view of a canal dynamic photodiode 100, which is one embodiment of the canal photodiodes disclosed herein. FIG. 2 is a cross-sectional view of canal dynamic photodiode 100 taken along line 2A-2A of FIG. 1, and FIG. 3 is a cross-sectional view of canal dynamic photodiode 100 taken along line 3A-3A of FIG. 1. FIGS. 1-3 include coordinate axes collectively showing a first direction 102, a second direction 104, and a third direction 106, where each of first direction 102, second direction 104, and third direction 106 is orthogonal to each other of first direction 102, second direction 104, and third direction 106. First direction 102 is not illustrated in FIG. 1, but first direction 102 can be considered normal to the page of FIG. 1. Similarly, second direction 104 is not illustrated in FIGS. 2 and 3, but second direction 104 can be considered normal to the page of FIGS. 2 and 3.

Figure 4:
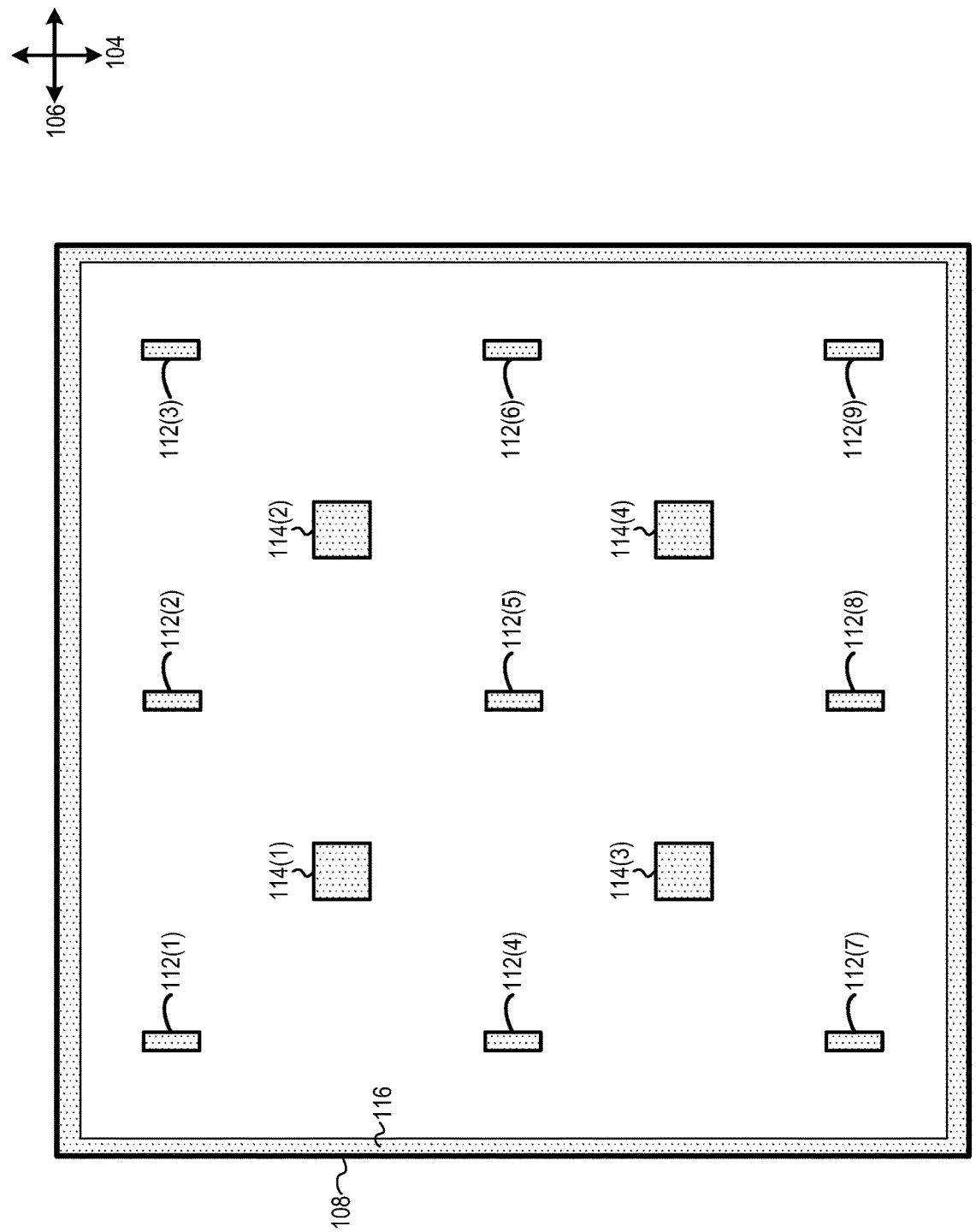
FIG. 4 is a top plan view of the FIG. 1 canal dynamic photodiode with a gate structure omitted.

Canal dynamic photodiode 100 includes a semiconductor substrate 108 and a gate structure 110. FIG. 4 is a top plan view of canal dynamic photodiode 100 with gate structure 110 omitted. Semiconductor substrate 108 includes a semiconductor material, such as silicon or germanium. Semiconductor substrate 108 additionally includes a plurality of anode regions 112, a plurality of cathode regions 114, and a substrate ring 116. In this document, specific instances of an item may be referred to by use of a numeral in parentheses (e.g., anode region 112(1)) while numerals without parentheses refer to any such item (e.g. anode regions 112). The quantity of anode regions 112, as well as the quantity of cathode regions 114, may vary as a design choice. In some embodiments, the body of semiconductor substrate 108 has a net P-type polarity, anode regions 112 have a net P-type polarity at a higher p-type concentration than the body of semiconductor substrate 108, and cathode regions 114 have a net N-type polarity. In some other embodiments, the body of semiconductor substrate 108 has a net N-type polarity, anode regions 112 have a net N-type polarity at a higher N-type concentration than the body of semiconductor substrate 108, and cathode regions 114 has a net P-type polarity. The "body" of semiconductor substrate 108 refers to portions of semiconductor substrate 108 that are not part of (a) anode regions 112, (b) cathode regions 114, (c) substrate ring 116, or (d) any other portions of semiconductor substrate 108 that are individually doped. Semiconductor substrate 108 may include additional features, e.g., additional doped regions and/or isolation regions, without departing from the scope hereof.

Gate structure 110 includes a dielectric layer 118 and a conductive layer 120 stacked on semiconductor substrate 108 in first direction 102, such that dielectric layer 118 is disposed between semiconductor substrate 108 and conductive layer 120 in first direction 102, as illustrated in FIGS. 2 and 3. Dielectric layer 118 is formed, for example, of silicon dioxide or a high-K dielectric material. Conductive layer 120 is formed, for example, of polysilicon or a metallic material. Gate structure 110 forms a plurality of apertures 122. While FIG. 1 depicts gate structure 110 forming four apertures 122, the number of apertures 122 formed by gate structure 110 may vary as a design choice.

Gate structure 110 is disposed on semiconductor substrate 108 in first direction 102 such that each cathode region 114 is disposed within a respective aperture 122, as seen when canal dynamic photodiode 100 is view in first direction 102. In particular, cathode region 114(1) is disposed within aperture 122(1), cathode region 114(2) is disposed within aperture 122(2), cathode region 114(3) is disposed within aperture 122(3), and cathode region 114(4) is disposed within aperture 122(4), as illustrated in FIG. 1. The number of apertures 122 formed by gate structure 110 may vary with the number of cathode regions 114, so that each cathode region 114 is disposed within a respective aperture 122. For example, in an embodiment of canal dynamic photodiode 100 where semiconductor substrate 108 includes nine cathode regions 114, gate structure 110 forms at least nine apertures 122, i.e., at least a respective aperture 122 for each of the nine cathode regions 114. Additionally, gate structure 110 is disposed on semiconductor substrate 108 such that each anode region 112 is within gate structure 110, e.g. such that each anode region 112 is at least partially surrounded by gate structure 110, as seen when canal dynamic photodiode 100 is viewed in first direction 102. Canal dynamic photodiode 100 is referred to as a "canal" photodiode because portions of gate structure 110 surrounding field regions 124 can be considered analogous to canals surrounding sections of land. As discussed below, the canal structure of canal dynamic photodiode 100 advantageously helps achieve high sensitivity to incident light.

Each cathode region 114 is separated from gate structure 110 by a respective field region 124 of semiconductor substrate 108, as seen when canal dynamic photodiode 100 is viewed in first direction 102. Specifically, cathode region 114(1) is separated from gate structure 110 by a field region 124(1), cathode region 114(2) is separated from gate structure 110 by a field region 124(2), cathode region 114(3) is separated from gate structure 110 by a field region 124(3), and cathode region 114(4) is separated from gate structure 110 by a field region 124(4). Additionally, substrate ring 116 is separated from gate structure 110 by a field region 126 of semiconductor substrate 108, as seen when canal dynamic photodiode 100 is viewed in first direction 102. Substrate ring 116 at least partially surrounds gate structure 110, as seen when canal dynamic photodiode 100 is viewed in first direction 102.

FIGS. 5-8 collectively illustrate an example of operation of canal dynamic photodiode 100. It is understood, however, that canal dynamic photodiode 100 is not limited to operating according to the examples of FIGS. 5-8. For example, canal dynamic photodiode 100 may be electrically biased in different manners than those illustrated in the examples of FIGS. 5-8.

FIG. 5A is cross-sectional view of canal dynamic photodiode 100 taken along line 2A-2A of FIG. 1, and FIG. 5B is a cross-sectional view of canal dynamic photodiode 100 taken along line 3A-3A of FIG. 1. FIGS. 5A and 5B collectively illustrate one example of electrical biasing of canal dynamic photodiode 100 in a reset operating mode. Some elements of canal dynamic photodiode 100 are not labeled in FIGS. 5A and 5B to promote illustrative clarity. The reset operating mode is characterized, for example, by anode regions 112 being reversed biased with respect to cathode regions 114, and gate structure 110 being grounded. Anode regions 112 are reversed biased with respect to cathode regions 114, for example, by grounding anode regions 112, e.g., by connecting them substrate ring 116 via electrical conductors 502, and by driving cathode regions 114 with a positive voltage $V_p$ with respect substrate ring 116 via electrical conductors 504. Gate structure 110 is grounded, for example, by connecting gate structure 110 to substrate ring 116 via electrical conductors 502. Minimal electric current flows from anode regions 112 to semiconductor substrate 108 in the reset operating mode.

FIG. 6A is a cross-sectional view of canal dynamic photodiode 100 taken along line 2A-2A of FIG. 1, and FIG. 6B is a cross-sectional view of canal dynamic photodiode 100 taken along line 3A-3A of FIG. 1. FIGS. 6A and 6B collectively illustrate one example of electrical biasing of canal dynamic photodiode 100 in a sensing operating mode. Some elements of canal dynamic photodiode 100 are not labeled in FIG. 6 to promote illustrative clarity. The sensing operating mode is characterized, for example, by (1) a positive voltage $V_g$ being applied to gate structure 110 via electrical conductors 602, (2) a positive voltage $V_a$ being application to anode regions 112 via electrical conductors 604, and (3) a positive voltage $V_k$ being applied to cathode regions 114 via electrical conductors 606, where $V_k$ is greater than $V_a$ and each of the aforementioned voltages is referenced to substrate ring 116. In some embodiments, $V_g$ is approximately 3.6 volts, $V_a$ is 1 volt, and $V_k$ is approximately 1.8 volts. Application of a positive voltage to gate structure 110 creates a depletion region 606 in semiconductor substrate 108 below gate structure 110, where depletion region 606 separates anode regions 112 from semiconductor substrate 108, thereby preventing significant flow of electric current from anode regions 112 to semiconductor substrate 108.

Figure 7:
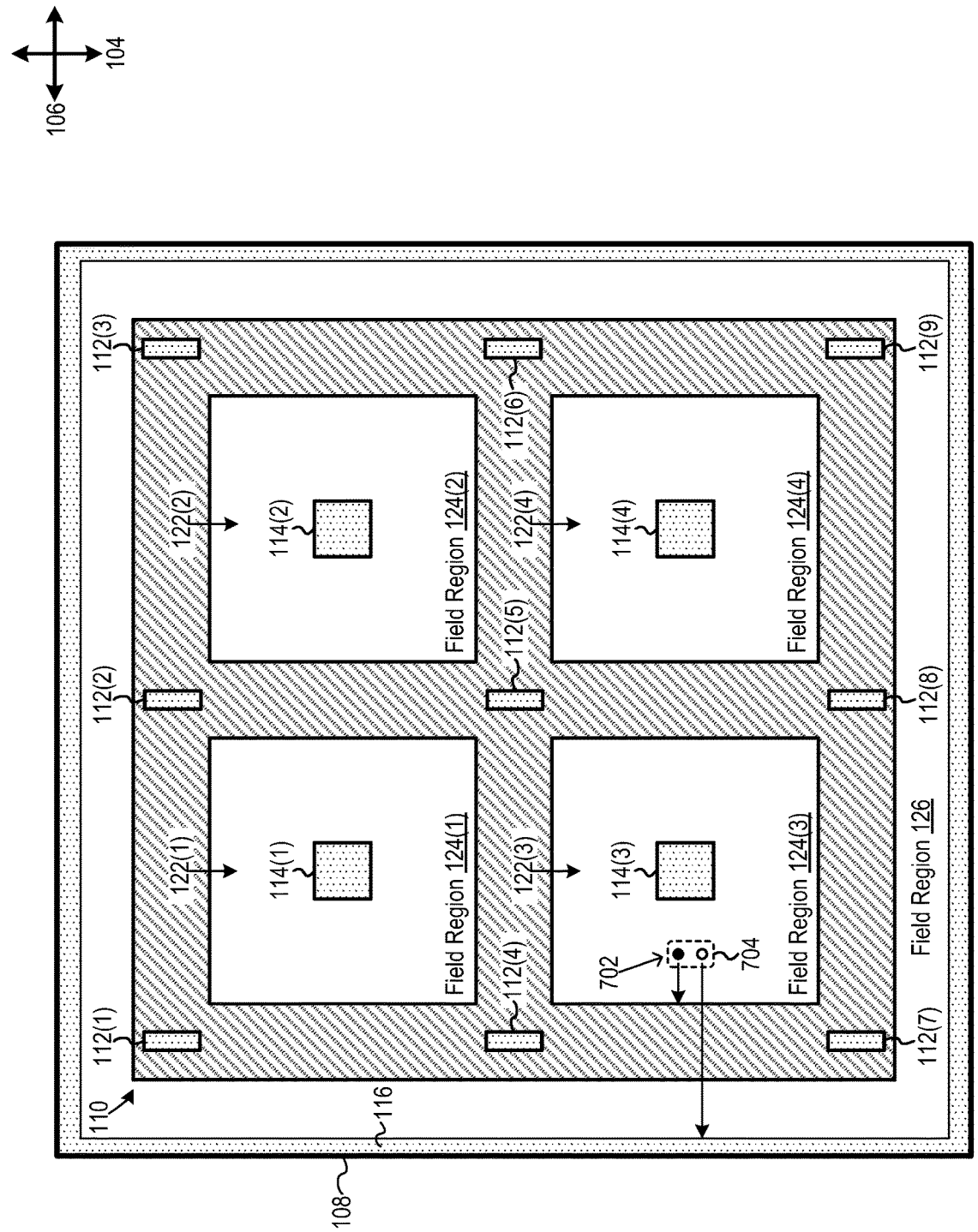
FIG. 7 is a top plan view of the FIG. 1 canal dynamic photodiode illustrating an example of an electron-hole pair generation in the sensing operating mode.
Figure 8:
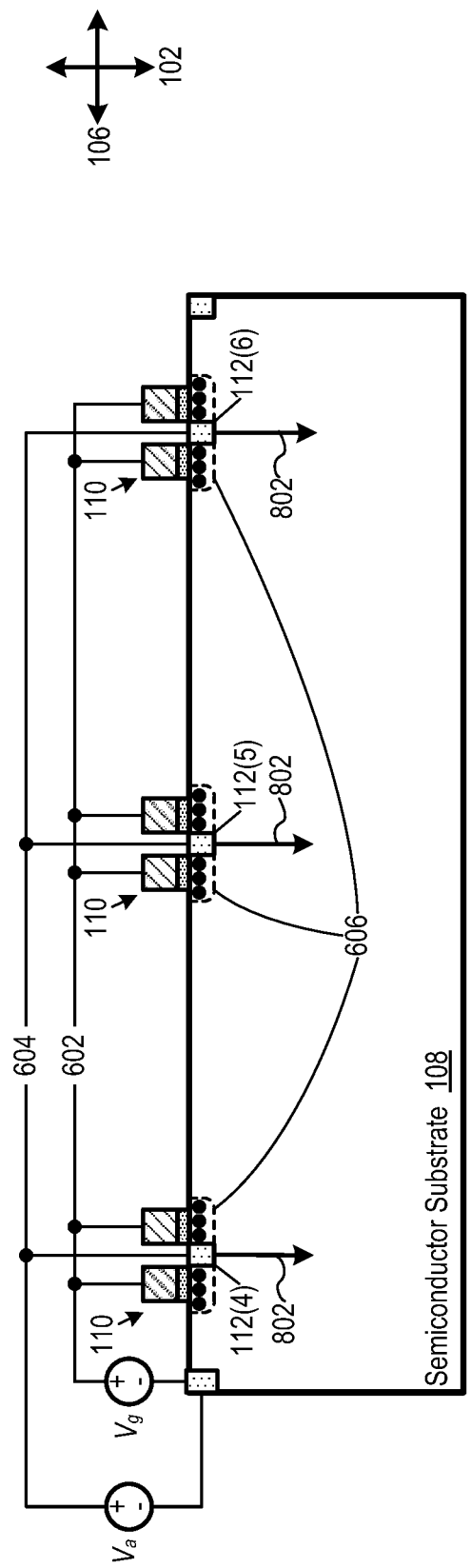
FIG. 8 is a cross-sectional view of the FIG. 1 canal dynamic photodiode illustrating operation after sufficient photo electrons have accumulated under the gate structure to lower a depletion barrier.

Light incident on a field region 124 or 126 in the sensing operating mode creates photo electrons and corresponding holes in the field region, where the electrons ideally flow to depletion region 606 and the holes flow to substrate 108 and ultimately to substrate ring 116. For example, FIG. 7 is a top plan view of canal dynamic photodiode 100 depicting incident light 702 on field region 124(3) creating an electron-hole pair 704 in field region 124(3). Photo electrons are symbolically shown as circles with black fill, and holes are symbolically shown as circles with white fill. The photo electron of pair 704 flows to depletion region 606 (not visible in FIG. 7) under gate structure 110, and the hole of pair 704 flows to semiconductor substrate 108 and ultimately to substrate ring 116. Photo electrons flowing to gate structure 110 decrease the depth of depletion region 606. For example, FIG. 8 is a cross-sectional view of canal dynamic photodiode 100 taken along line 3A-3A of FIG. 1 after sufficient photo electrons have accumulated under gate structure 110 to lower a depletion barrier of depletion region 606 such that a hole current 802 flows from anode regions 112 to semiconductor substrate 108. A triggering time of canal dynamic photodiode 100 is a time for magnitude of hole current 802 to reach a predetermined threshold value, e.g., 1 microamp. Triggering time decreases with increasing intensity of light incident on field regions 124 and/or field region 126, and intensity of light incident on canal dynamic photodiode 100 can therefore be determined from triggering time of canal dynamic photodiode 100. Triggering time of canal dynamic photodiode 100 is also a function of wavelength of light incident on canal dynamic photodiode 100.

It should be appreciated that the canal configuration of canal dynamic photodiode 100 results in each field region 124 and 126 being relatively close to gate structure 110. Consequently, photo electrons do not have to travel far in a field region to reach a depletion region under gate structure 110, such as depletion region 606, thereby promoting efficient accumulation of photo electrons under gate structure 110. Stated differently, the canal configuration of canal dynamic photodiode 100 helps maximize the percent of photo electrons which reach a depletion region under gate structure 110. Such efficient photo electron accumulation, in turn, promotes short triggering time and corresponding high sensitivity of canal dynamic photodiode 100 to incident light.

Figure 9:
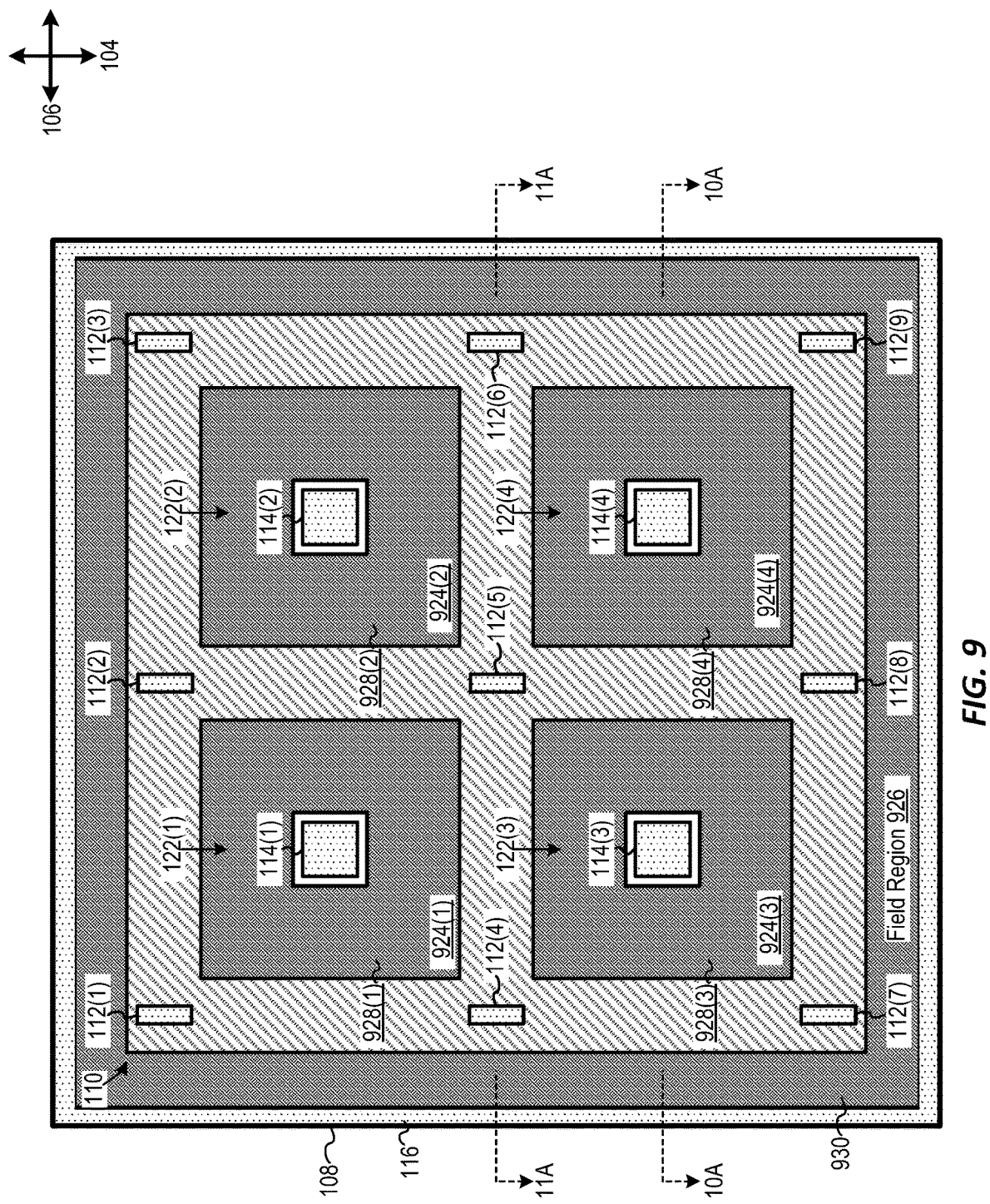
FIG. 9 is a top plan view of an alternate embodiment of the FIG. 1 canal dynamic photodiode including doped surface regions.
Figure 10:
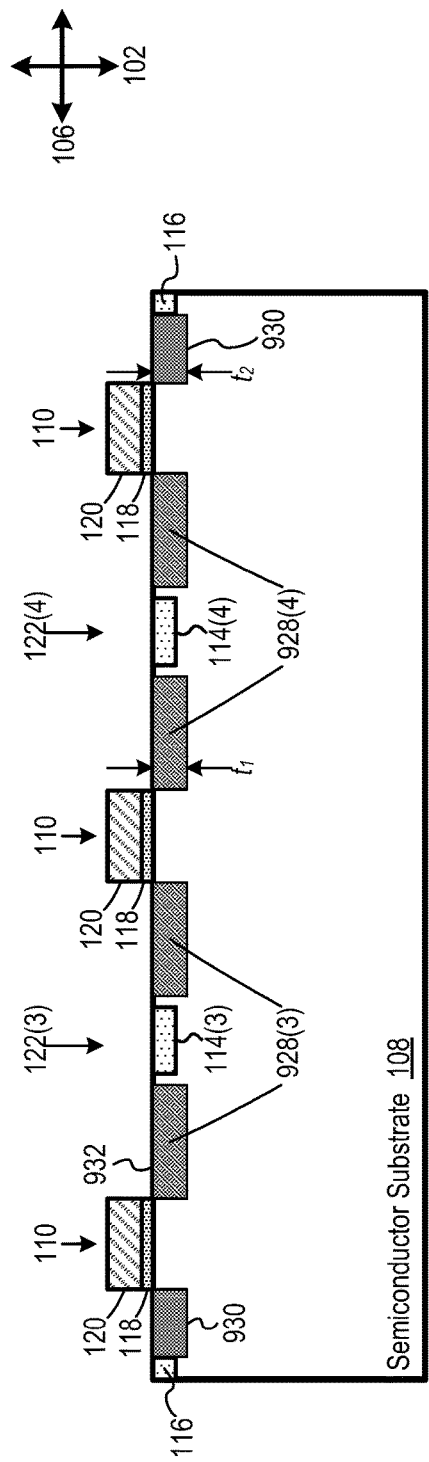
FIG. 10 is a cross-sectional view of the FIG. 9 canal dynamic photodiode.
Figure 11:
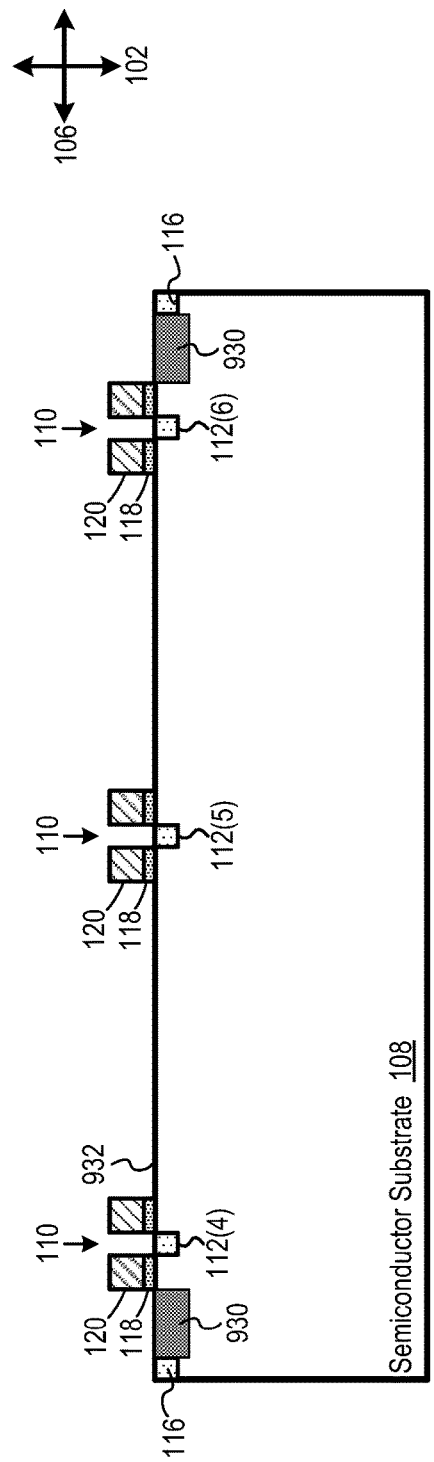
FIG. 11 is another cross-sectional view of the FIG. 9 canal dynamic photodiode.

Some photo electrons generated in a field region of a dynamic photodiode may flow to a cathode region instead of to a gate structure, which decreases efficiency of photo electron accumulation under the gate structure, thereby decreasing dynamic photodiode sensitivity. Applicant has found that this problem may be mitigated by engineered doping of field regions between cathode regions and a gate structure in a manner which promotes flow of electrons to the gate structure instead of to the cathode regions. For example, FIG. 9 is a top plan view of a canal dynamic photodiode 900, which is an alternate embodiment of canal dynamic photodiode 100 implementing engineered doping of field regions. FIG. 10 is a cross-sectional view of canal dynamic photodiode 900 taken along line 10A-10A of FIG. 9, and FIG. 11 is a cross-sectional view of canal dynamic photodiode 900 taken along line 11A-11A of FIG. 9. Canal dynamic photodiode 900 is like canal dynamic photodiode 100 except that (a) field regions 124 are replaced with field regions 924 and (b) field region 126 is replaced with field region 926.

Each field region 924 includes a respective doped surface region 928 (designated by shading in the figures) bordering a top surface 932 (see FIGS. 10 and 11) of semiconductor substrate 108 in first direction 102. Doped surface regions 928 have a thickness $t_1$ in first direction 102, and as such, doped surface regions 928 extend from top surface 932 into semiconductor substrate 108 in first direction 102 to a depth equal to thickness $t_1$. In some embodiments, thickness $t_1$ is one micrometer or less. In certain embodiments, such as illustrated in the present figures, doped surface regions 928 do not contact cathode regions 114, as seen when canal dynamic photodiode 100 is viewed in first direction 102, to facilitate removal of electrons from field regions 924 during reset operation of canal dynamic photodiode 900.

Field region 926 includes a doped surface region 930 (designated by shading in the figures) bordering top surface 932 of semiconductor substrate 108 in first direction 102. Doped surface region 930 has a thickness $t_2$ in first direction 102, and as such, doped surface region 930 extends from top surface 932 into semiconductor substrate 108 in first direction 102 to a depth equal to thickness $t_2$. In some embodiments, thickness $t_2$ is one micrometer or less.

Doped surface regions 928 and 930 have a higher net dopant concentration than the body of semiconductor substrate 108. For example, doped surface regions 928 and 930 have a higher net dopant concentration than (a) portions of semiconductor substrate 108 below gate structure 110 in first direction 102 and (b) portions of semiconductor substrate 108 below cathode regions 114 in first direction 102. In embodiments where the body of semiconductor substrate 108 has a net P-type polarity, doped surface regions 928 and 930 have a net P-type polarity at a higher P-type concentration than the body semiconductor substrate 108. Additionally, in embodiments where the body of semiconductor substrate 108 has a net N-type polarity, doped surface regions 928 and 930 have a net N-type polarity at a higher N-type concentration than the body semiconductor substrate 108.

Figure 12:
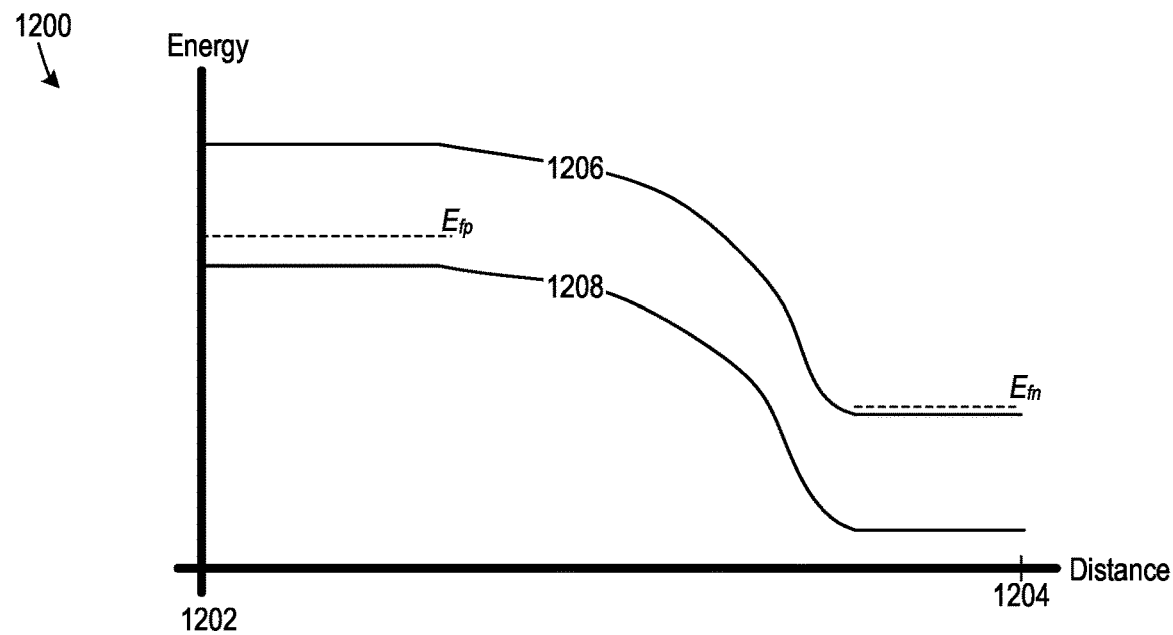
FIG. 12 is an energy diagram of one embodiment of the FIG. 1 canal dynamic photodiode.

Doped surface regions 928 and 930 increase likelihood that photo electrons will flow to gate structure 110 instead of to cathode regions 114, thereby helping prevent loss of sensitivity from photo electrons flowing to cathode regions 114. To help understand how doped surface regions 928 and 930 achieve this advantage, consider FIGS. 12 and 13. FIG. 12 is an energy diagram 1200 illustrating energy versus distance in one embodiment of canal dynamic photodiode 100 of FIGS. 1-3 where (a) the body of semiconductor substrate 108 has a net P-type polarity and (b) cathode regions 114 have a net N-type polarity. Point 1202 on the horizontal axis of energy diagram 1200 represent a field region 124, and point 1204 on the horizontal axis of energy diagram 1200 represents a cathode region 114. As such, the horizontal axis of graph 1200 spans a portion of canal dynamic photodiode 100 from a field region 124 to a cathode region 114. Energy diagram 1200 includes a curve 1206 representing a conduction band and a curve 1208 representing a valence band line. Energy diagram 1200 further includes dashed lines representing a Fermi Level with P-type doping ($E_{fp}$) and a Fermi Level with N-type doping ($E_{fn3}$). As evident from FIG. 12, electrons are prone to flow toward cathode regions 114, instead of towards gate structure 110, due to there being no electron barrier to suppress electrons from flowing to cathode regions 114.

Figure 13:
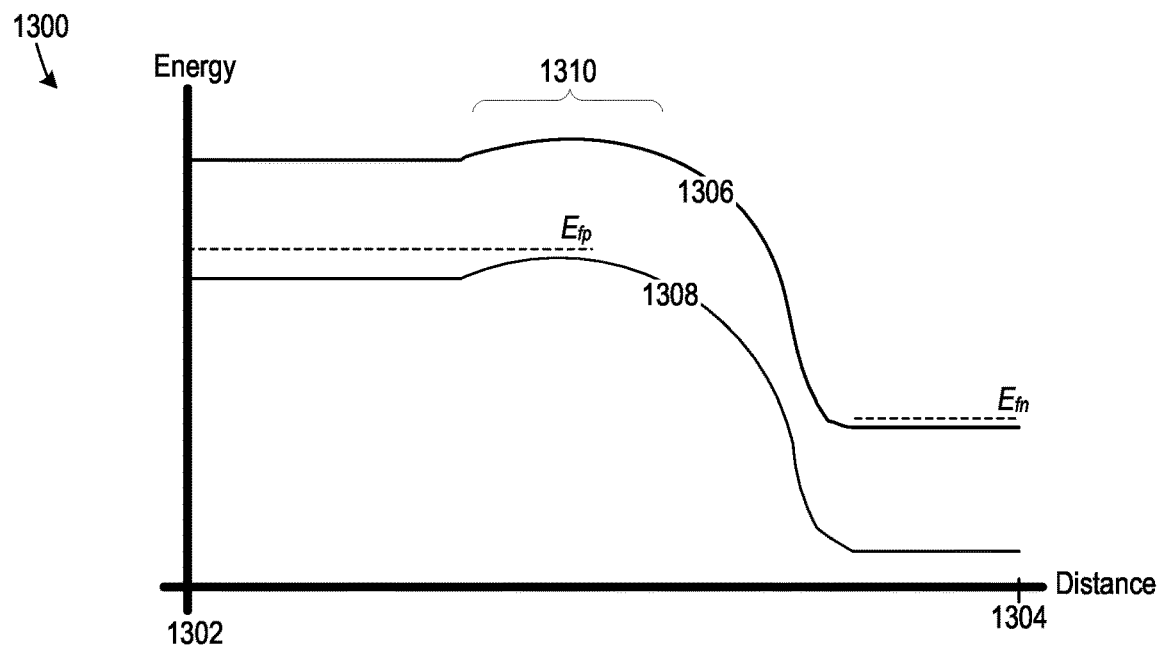
FIG. 13 is an energy diagram of one embodiment of the FIG. 9 canal dynamic photodiode.

FIG. 13 is an energy diagram 1300 illustrating energy versus distance in one embodiment of canal dynamic photodiode 900 of FIGS. 9-11 where (a) the body of semiconductor substrate 108 has a net P-type polarity and (b)

cathode regions 114 have a net N-type polarity. Point 1302 on the horizontal axis of energy diagram 1300 represent a field region 924, and point 1304 on the horizontal axis of energy diagram 1300 represents a cathode region 114. As such, the horizontal axis of graph 1300 spans a portion of canal dynamic photodiode 100 from a field region 924 to a cathode region 114. Energy diagram 1300 includes a curve 1306 representing a conduction band and a curve 1308 representing a valence band line. Energy diagram 1300 further includes dashed lines representing a Fermi Level with P-type doping ($E_{fp}$) and a Fermi Level with N-type doping ($E_{fn}$). Energy of each of the conduction band and the valence band increases in a region 1310 due to presence of doped surface regions 928 in field regions 924. Such increase in band energy presents a barrier to photo electron flow to cathode regions 114, thereby increasing likelihood of photo electrons flowing to gate structure 110 instead of to cathode regions 114, which promotes efficient accumulation of photo electrons under gate structure 110 and associated high sensitivity of canal dynamic photodiode 900.

The concept of engineered doping of field regions, e.g., to include to doped surface regions in field regions, is not limited to canal dynamic photodiodes. Rather, the concept could be applied to other types of dynamic photodiodes, e.g., to centralized dynamic photodiodes, by including one or more doped surface regions in one or more field regions, where the doped surface regions have a higher net dopant concentration than the body of a semiconductor substrate of a dynamic photodiode.

Figure 14:
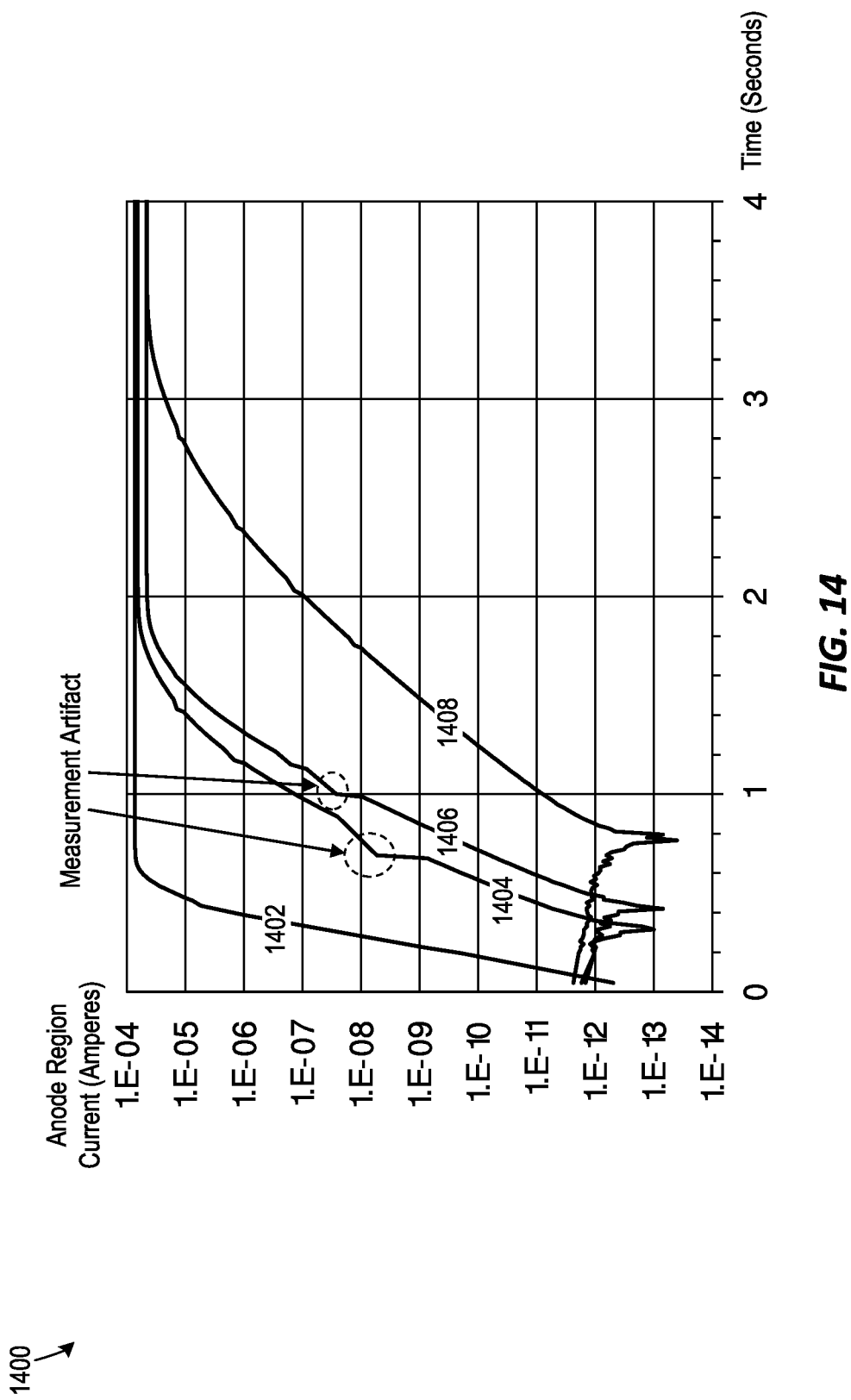
FIG. 14 is a graph of anode region current versus time for four dynamic photodiodes in a sensing operating mode

Applicant has conducted empirical testing of a couple of embodiments of the new canal photodiodes which shows that the canal photodiodes can achieve higher performance than conventional dynamic photodiodes. For example, FIG. 14 is a graph 1400 of anode region current versus time for four dynamic photodiodes during a sensing operating mode when exposed to light. The data of graph 1400 was determined from empirical testing and includes two measurement artifacts, as illustrated in FIG. 14. Curve 1402 represents one embodiment of canal dynamic photodiode 900 (FIGS. 9-11), curve 1404 represents one embodiment of canal dynamic photodiode 100 (FIGS. 1-3), curve 1406 represents a centralized dynamic photodiode implementing engineered doping of field regions, and curve 1408 represents a conventional centralized dynamic photodiode. Assume that triggering time is defined as time required for magnitude of anode region current to reach a threshold value of one microamp. As evident from FIG. 14, the two canal dynamic photodiodes had a shorter triggering time than the two centralized dynamic photodiodes. Additionally, FIG. 14 shows that inclusion of doped surface regions in field regions decreased triggering time in both the canal dynamic photodiode and the centralized dynamic photodiode.

Figure 15:
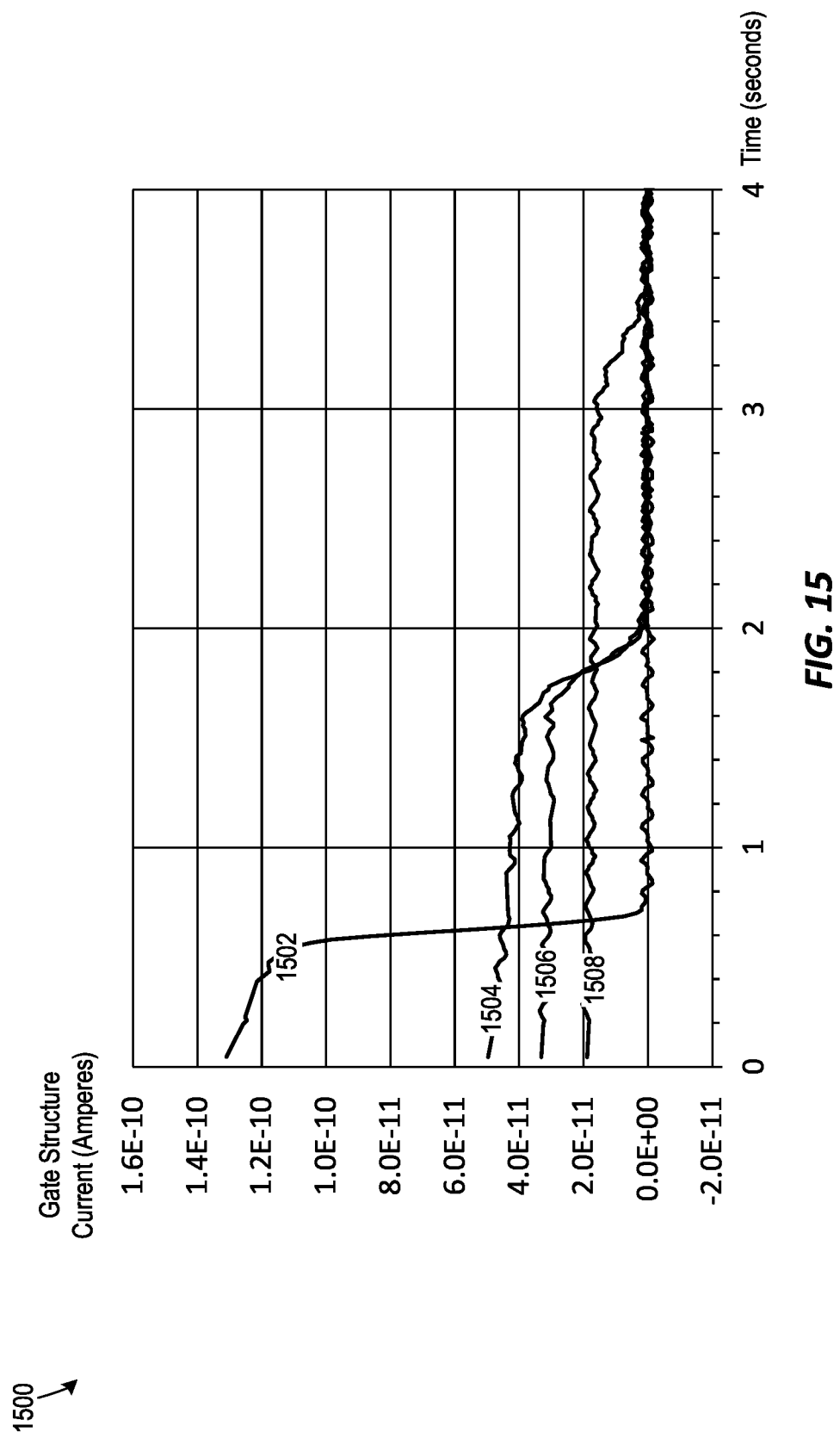
FIG. 15 is a graph of gate structure current versus time for four dynamic photodiodes in a sensing operating mode.

As another example, FIG. 15 is a graph 1500 of gate structure current versus time for four dynamic photodiodes during a sensing operating mode when exposed to light, where the data of graph 1500 was determined from empirical testing. Curve 1502 represents one embodiment of canal dynamic photodiode 900 (FIGS. 9-11), curve 1504 represents one embodiment of canal dynamic photodiode 100 (FIGS. 1-3), curve 1506 represents a centralized dynamic photodiode implementing engineered doping of field regions, and curve 1508 represents a conventional centralized dynamic photodiode. Gate structure current in FIG. 15 is associated with electron charging current to channel under a gate structure. As evident from FIG. 15, the two canal dynamic photodiodes had larger peak gate structure current magnitudes than the two centralized dynamic photodiodes. Additionally, FIG. 15 shows that inclusion of doped surface regions in field regions increased peak gate structure current magnitude for both the canal dynamic photodiode and the centralized dynamic photodiode.

As an additional example, TABLE 1 below includes measurements performed on the following four dynamic photodiodes: (a) a conventional centralized dynamic photodiode, (b) a centralized dynamic photodiode implementing engineered doping of field regions, (c) one embodiment of canal dynamic photodiode 100 (FIGS. 1-3), and (d) one embodiment of canal dynamic photodiode 900 (FIGS. 9-11). TABLE 1 includes the following measurement values for each of the four dynamic photodiodes: (a) gate structure current in amperes (A), (b) cathode region current in amperes, (c) triggering time in seconds (S), (d) total charge collected in channel ($Q_c$) in Coulombs (C), (e) total charge lost to cathode regions ($Q_k$) in Coulombs, and (d) ratio of $Q_k/Q_c$.

TABLE 1

|  | Conventional Centralized DPD | Centralized DPD With Engineered Field Doping Regions | Embodiment of Canal DPD 100 | Embodiment of Canal DPD 900 |
| --- | --- | --- | --- | --- |
| Gate Structure Current (A) | 1.763E−11 | 3.147E−11 | 4.486E−11 | 1.266E−10 |
| Cathode Region Current (A) | 1.911E−10 | Noise Floor | 1.898E−10 | 3.535E−12 |
| Triggering Time (S) | 2.327 | 1.312 | 1.156 | 0.389 |
| $Q_c$ (C) | 4.103E−11 | 4.131E−11 | 5.187E−11 | 4.925E−11 |
| $Q_k$ (C) | 4.446E−10 | Noise Floor | 2.195E−10 | 1.375E−12 |
| $Q_k/Q_c$ | 10.84 | N/A | 4.231 | 0.028 |

TABLE 1 shows that the canal configuration, as well as engineered doping of field regions, helped achieve high performance. For example, the canal dynamic photodiodes of TABLE 1 had shorter triggering times than the central dynamic photodiodes. Additionally, the dynamic photodiodes including engineered doping of field regions had shorter triggering times than corresponding dynamic photodiodes without engineered doping of field regions. Furthermore, TABLE 1 shows that both the canal configuration and engineered doping of field regions reduced charge lost to cathode regions.

Figure 16:
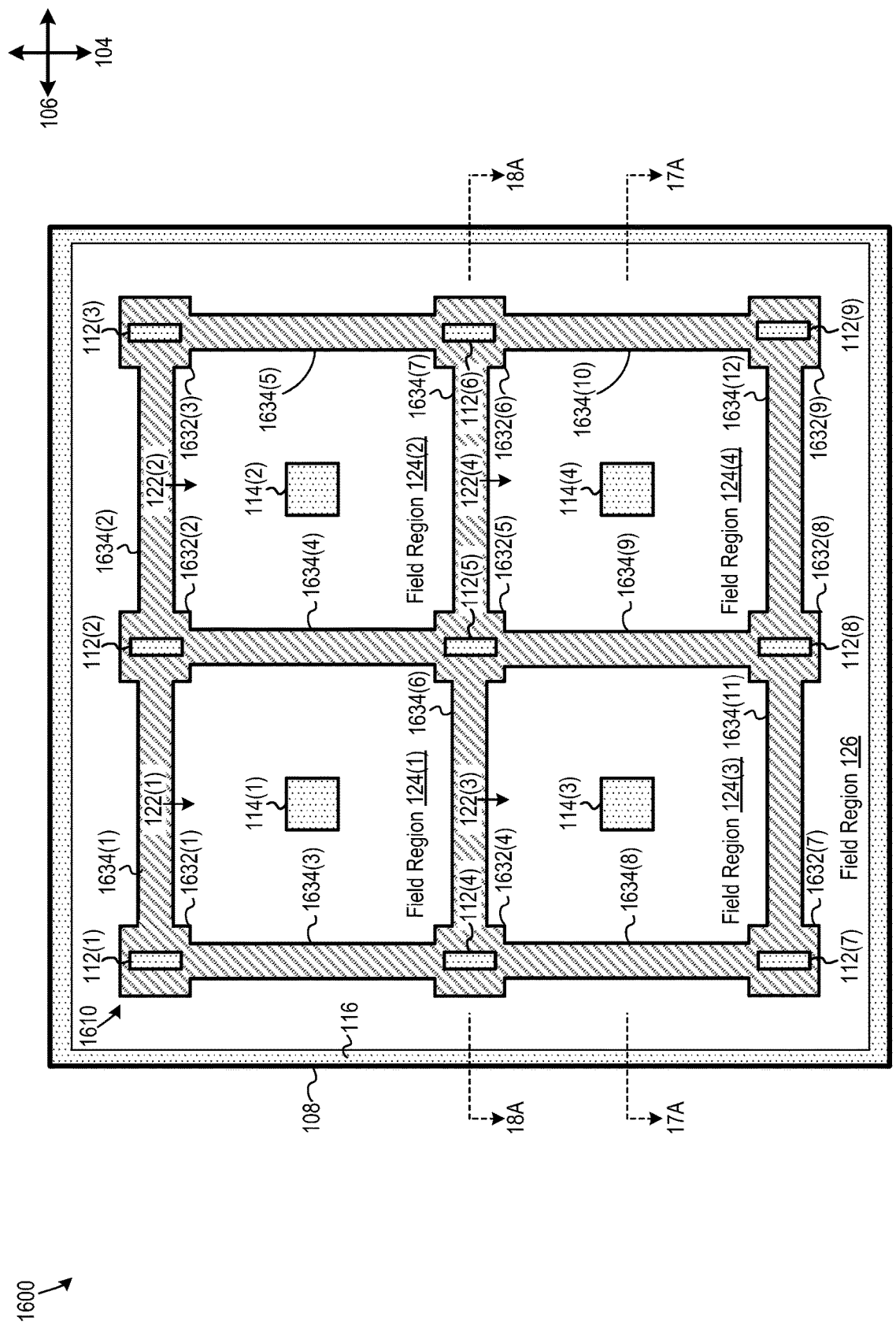
FIG. 16 is a top plan view of an alternate embodiment of the FIG. 1 canal dynamic photodiode.
Figure 17:
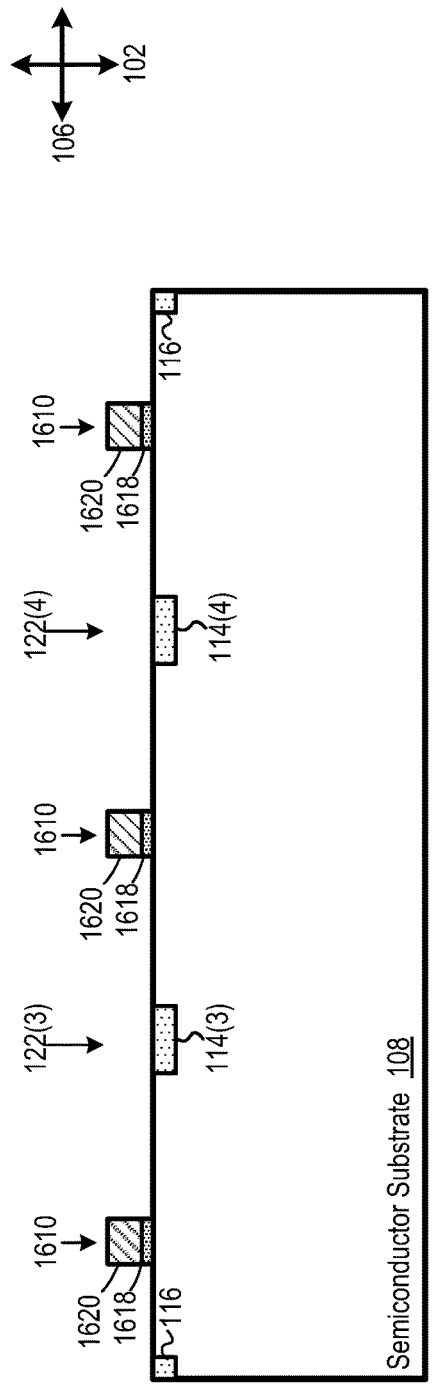
FIG. 17 is a cross-sectional view of the FIG. 16 canal dynamic photodiode.
Figure 18:
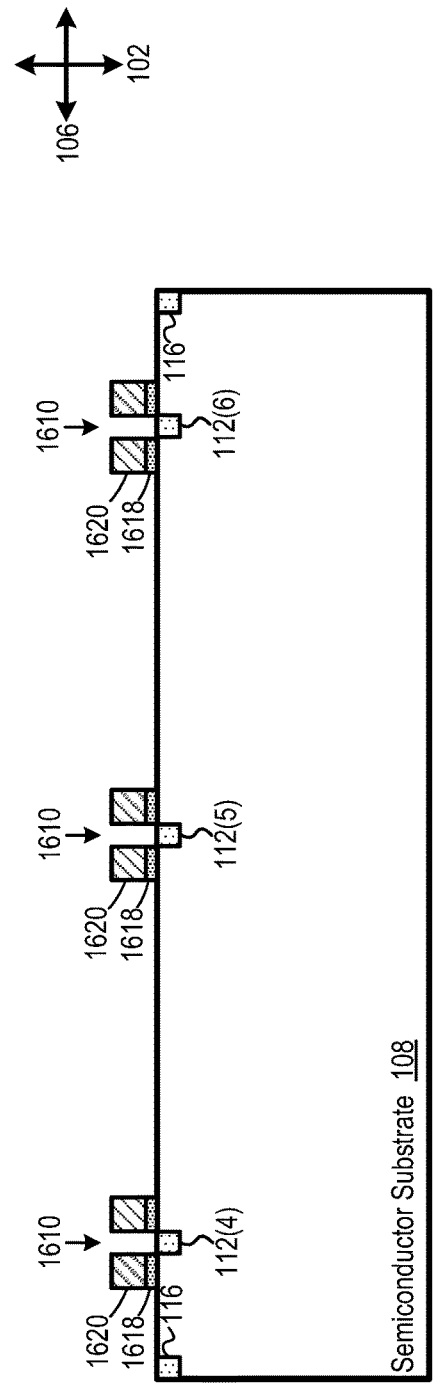
FIG. 18 is another cross-sectional view of the FIG. 16 canal dynamic photodiode.

FIG. 16 is a top plan view of a canal dynamic photodiode 1600, which is an alternate embodiment of canal dynamic photodiode 100 of FIG. 1. FIG. 17 is a cross-sectional view of canal dynamic photodiode 1600 taken along line 17A-17A of FIG. 16, and FIG. 18 is a cross-sectional view of canal dynamic photodiode 1600 taken along line 18A-18A of FIG. 16. Canal dynamic photodiode 1600 is like canal dynamic photodiode 100 except that gate structure 110 is replaced with a gate structure 1610. Gate structure 1610 includes a dielectric layer 1618 and a conductive layer 1620, which are embodiments of dielectric layer 118 and conductive layer 120, respectively. Gate structure 1610 has a different shape than gate structure 110. Specifically, portions 1632 of gate structure 1610 including anode regions 112 are wider than portions 1634 of gate structure 1610 between anode regions 112, as illustrated in FIG. 16.

Figure 19:
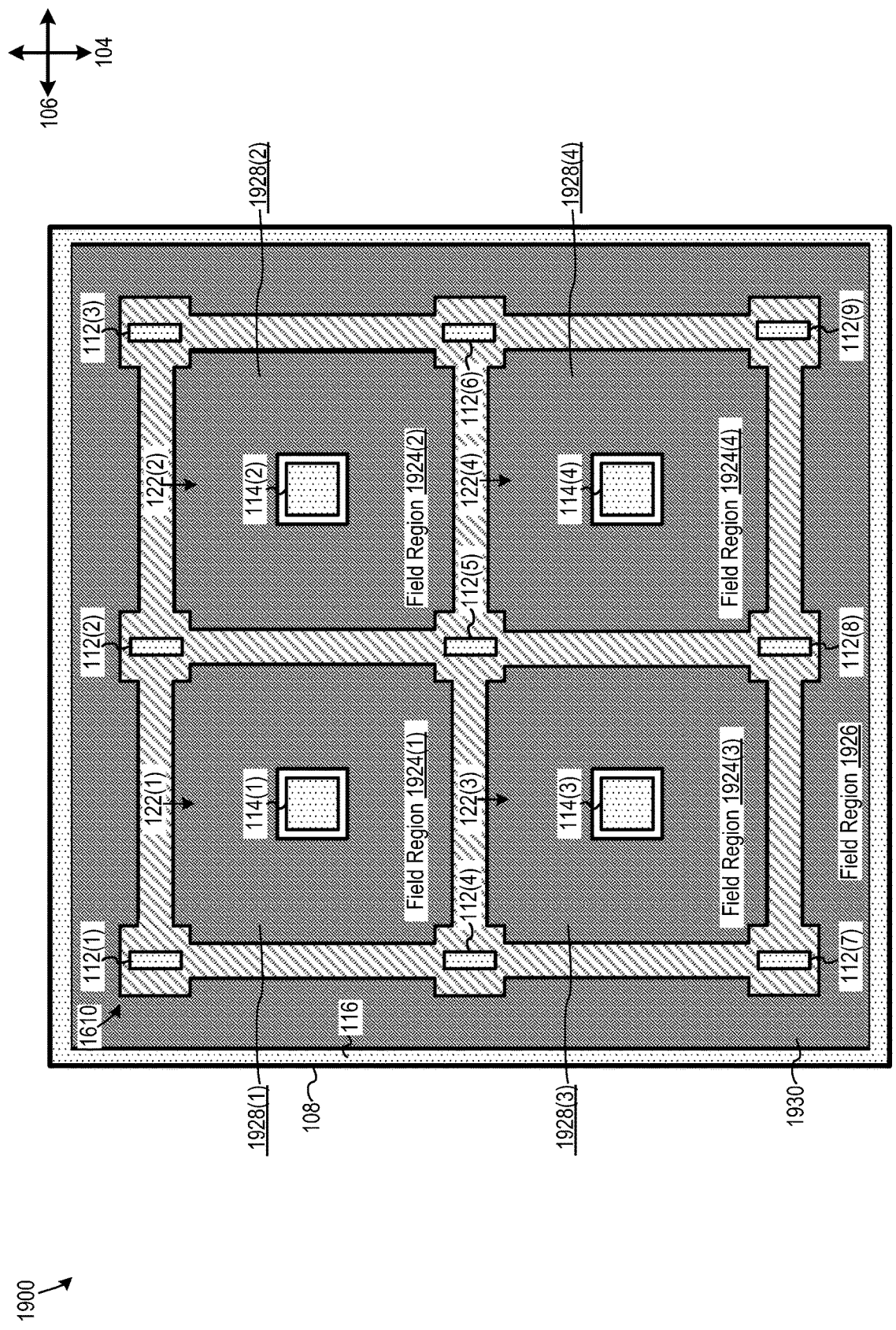
FIG. 19 is a top plan view of an alternate embodiment of the FIG. 16 canal dynamic photodiode implementing engineered doping of field regions.

Canal dynamic photodiode 1600 may be modified to implement engineered doping of field regions 124 and/or field region 126. For example, FIG. 19 is a top plan view of a canal dynamic photodiode 1900, which is an alternate embodiment of canal dynamic photodiode 1600 implementing engineered doping of field regions. Canal dynamic photodiode 1900 is like canal dynamic photodiode 1600 except that (a) field regions 124 are replaced with field regions 1924, and (b) field region 126 is replaced with field region 1926. Each field region 1924 includes a doped surface region 1928 (designated by shading) bordering a top surface of semiconductor substrate 108 in first direction 102. Additionally, field region 1926 includes a doped surface region 1930 (designated by shading) bordering a top surface of semiconductor substrate 108 in first direction 102. Doped surface regions 1928 and 1930 extend from the top surface of semiconductor substrate 108 into semiconductor substrate 108 in first direction 102, for example, by one micrometer of less. In certain embodiments, such as illustrated in FIG. 19, doped surface regions 1928 do not contact cathode regions 114, as seen when canal dynamic photodiode 1900 is viewed in first direction 102, to facilitate removal of electrons from field regions 1924 during reset operation of canal dynamic photodiode 1900.

Doped surface regions 1928 and 1930 have a higher net dopant concentration than the body of semiconductor substrate 108. For example, doped surface regions 1928 and 1930 have a higher net dopant concentration than (a) portions of semiconductor substrate 108 below gate structure 1610 in first direction 102 and (b) portions of semiconductor substrate 108 below cathode regions 114 in first direction 102. In embodiments where the body of semiconductor substrate 108 has a net P-type polarity, doped surface regions 1928 and 1930 have a net P-type polarity at a higher P-type concentration than the body semiconductor substrate 108. Additionally, in embodiments where the body of semiconductor substrate 108 has a net N-type polarity, doped surface regions 1928 and 1930 have a net N-type polarity at a higher N-type concentration than the body semiconductor substrate 108.

Figure 20:
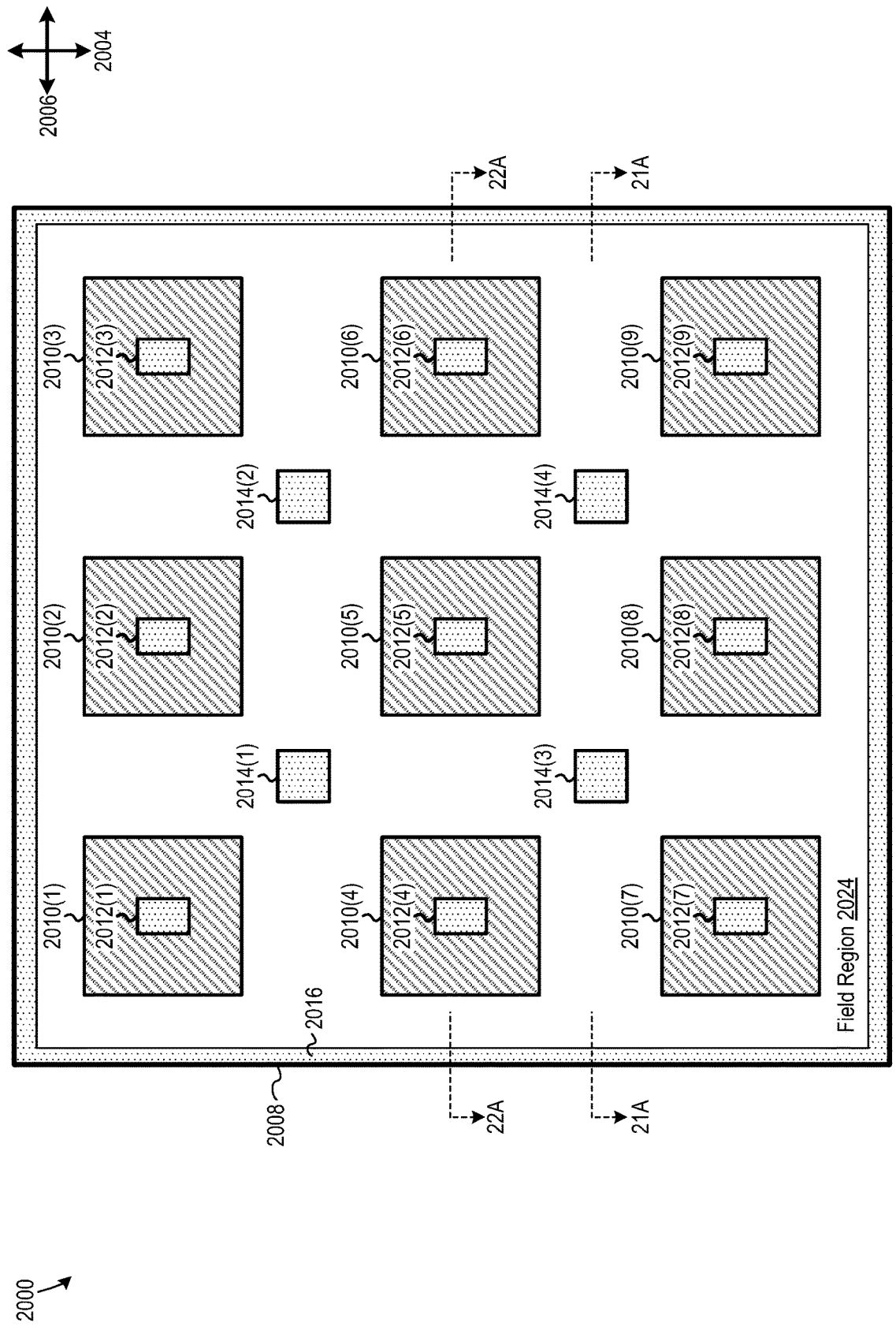
FIG. 20 is a top plan view of another dynamic photodiode, according to an embodiment.
Figures 21, 22:
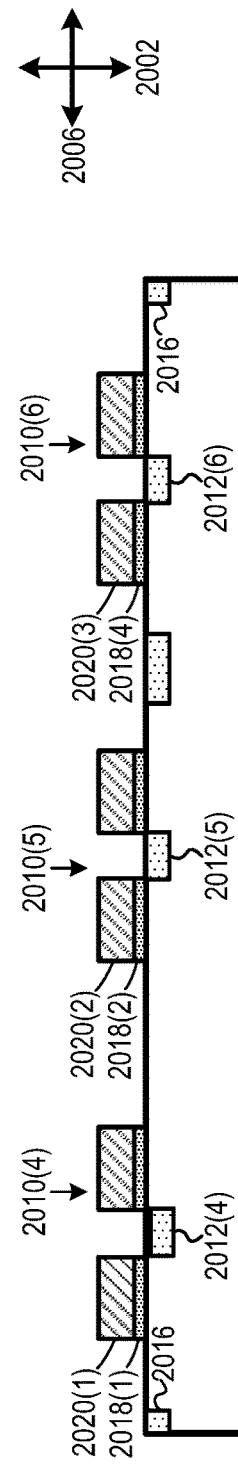
FIG. 21 is a cross-sectional view of the FIG. 20 dynamic photodiode.
FIG. 22 is another cross-sectional view of the FIG. 20 dynamic photodiode.

The canal dynamic photodiodes disclosed above may be considered distributed dynamic photodiodes because their gate structures, their anode regions, and their cathode regions are distributed instead of being centralized. Other distributed dynamic photodiode configurations are possible and are considered within the scope of this disclosure. For example, FIG. 20 is a top plan view of a dynamic photodiode 2000, which is another embodiment of a distributed dynamic photodiode. FIG. 21 is a cross-sectional view of dynamic photodiode 2000 taken along line 21A-21A of FIG. 20, and FIG. 22 is a cross-sectional view of dynamic photodiode 2000 taken along line 22A-22A of FIG. 20. FIGS. 20-22 include coordinate axes collectively showing a first direction 2002, a second direction 2004, and a third direction 2006, where each of first direction 2002, second direction 2004, and third direction 2006 is orthogonal to each other of first direction 2002, second direction 2004, and third direction 2006. First direction 2002 is not illustrated in FIG. 20, but first direction 2002 can be considered normal to the page of FIG. 20. Similarly, second direction 2004 is not illustrated in FIGS. 21 and 22, but second direction 2004 can be considered normal to the page of FIGS. 21 and 22.

Dynamic photodiode 2000 includes a semiconductor substrate 2008 and a plurality of gate structures 2010. Semiconductor substrate 2008 includes a semiconductor material, such as silicon or germanium. Semiconductor substrate 2008 additionally includes a plurality of anode regions 2012, a plurality of cathode regions 2014, and a substrate ring 2016. The quantity of anode regions 2012, as well as the quantity of cathode regions 2014, may vary as a design choice. In some embodiments, the body of semiconductor substrate 2008 has a net P-type polarity, anode regions 2012 have a net P-type polarity at a higher p-type concentration than the body of semiconductor substrate 2008, and cathode regions 2014 have a net N-type polarity. In some other embodiments, the body of semiconductor substrate 2008 has a net N-type polarity, anode regions 2012 have a net N-type polarity at a higher N-type concentration than the body semiconductor substrate 2008, and cathode regions 2014 have a net P-type polarity. The "body" of semiconductor substrate 2008 refers to portions of semiconductor substrate 2008 that are not part of (a) anode regions 2012, (b) cathode regions 2014, (c) substrate ring 2016, or (d) any other portions of semiconductor substrate 2008 that are individually doped. Semiconductor substrate 2008 may include additional features, e.g., additional doped regions and/or isolation regions, without departing from the scope hereof.

Each gate structure 2010 includes a dielectric layer 2018 and a conductive layer 2020 stacked on semiconductor substrate 2008 in first direction 2002, such that in a given gate structure 2010, dielectric layer 2018 is disposed between semiconductor substrate 2008 and conductive layer 2020 in first direction 2002, as illustrated in FIG. 22. Each dielectric layer 2018 is formed, for example, of silicon dioxide or a high-K dielectric material. Each conductive layer 2020 is formed, for example, of polysilicon or a metallic material. Each gate structure 2010 is disposed on semiconductor substrate 2008 such that each anode region 2012 is within a respective gate structure 2010, e.g. such that each anode region 2012 is at least partially surrounded by a respective gate structure 2010, as seen when dynamic photodiode 2000 is viewed in first direction 2002.

Each cathode region 2014 is separated from each gate structure 2010 by a field region 2024 of semiconductor substrate 2008, as seen when dynamic photodiode 2000 is viewed in first direction 2002. Substrate ring 2016 at least partially surrounds each gate structure 2010 and each cathode region 2014, as seen dynamic photodiode 2000 is viewed in first direction 2002. Dynamic photodiode 2000 operates, for example, in a manner similar to that discussed above with respect to canal dynamic photodiode 100. However, there will be a separate depletion region for each gate structure 2010 when dynamic photodiode 2000 operates in the sensing operating mode, and two or more anode regions 2012 may begin to conduct significant current to semiconductor substrate 2008 at different respective times, which may cause an effective channel area of dynamic photodiode 2000 to be less than an effective channel area of canal dynamic photodiode 100. Consequently, dynamic photodiode 2000 may have a smaller signal to noise ratio than canal dynamic photodiode 100.

Figure 23:
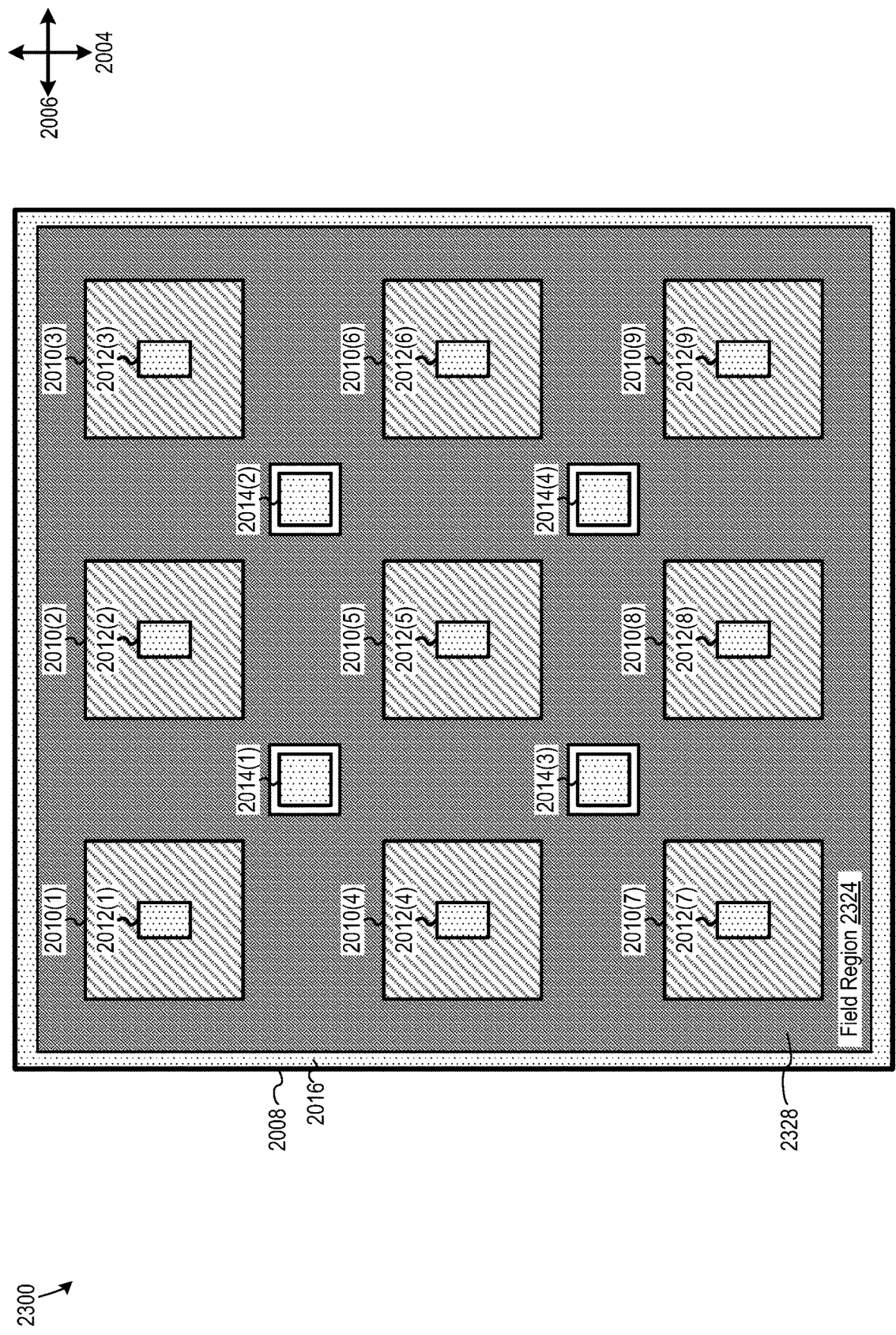
FIG. 23 is a top plan view of an alternate embodiment of the FIG. 20 dynamic photodiode implementing engineered doping of a field region.

Dynamic photodiode 2000 may be modified to implement engineered doping of field region 2024. For example, FIG. 23 is a top plan view of a dynamic photodiode 2300, which is an alternate embodiment of dynamic photodiode 2000 implementing engineered doping of a field region. Dynamic photodiode 2300 is like dynamic photodiode 2000 except that field region 2024 is replaced with a field region 2324. Field region 2324 includes doped surface region 2328 (designated by shading) bordering a top surface of semiconductor substrate 2008 in first direction 2002. Doped surface region 2328 extends from the top surface of semiconductor substrate 2008 into semiconductor substrate 2008 in first direction 2002, for example, by one micrometer of less. In certain embodiments, such as illustrated in FIG. 23, doped surface region 2328 does not contact cathode regions 2014, as seen when dynamic photodiode 2300 is viewed in first direction 2002, to facilitate removal of electrons from field region 2324 during reset operation of dynamic photodiode 2300.

Doped surface region 2328 has a higher net dopant concentration than the body of semiconductor substrate 2008. For example, doped surface region 2328 has a higher net dopant concentration than (a) portions of semiconductor substrate 2008 below gate structures 2010 in first direction 2002 and (b) portions of semiconductor substrate 2008 below cathode regions 2014 in first direction 2002. In embodiments where the body of semiconductor substrate 2008 has a net P-type polarity, doped surface region 2328 has a net P-type polarity at a higher P-type concentration than the body semiconductor substrate 2008. Additionally, in embodiments where the body of semiconductor substrate 2008 has a net N-type polarity, doped surface region 2328 has a net N-type polarity at a higher N-type concentration than the body semiconductor substrate 2008.

Figure 24:
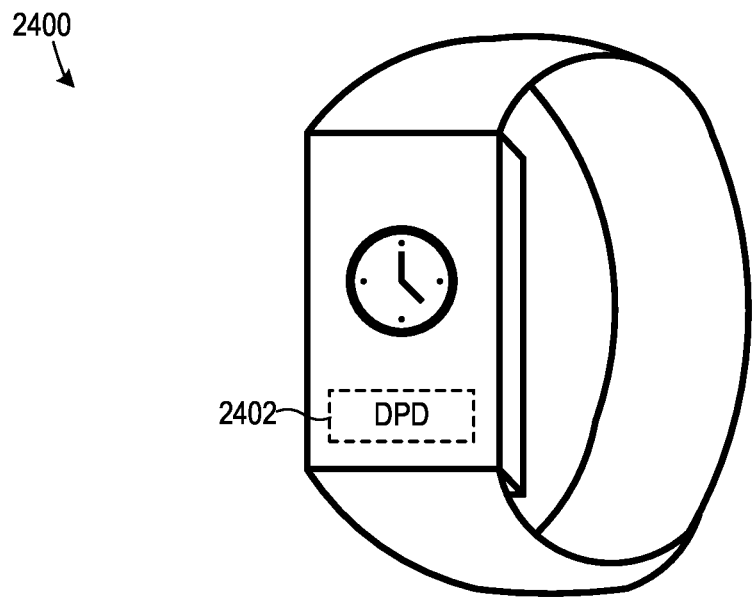
FIG. 24 is an illustration of a wristwatch including a dynamic photodiode, according to an embodiment.

The high sensitivity of the new dynamic photodiodes disclosed herein may make them particularly well suited for applications requiring a small size, such as for use in wearable medical sensing devices (e.g., heart rate monitors or oximeters). For example, FIG. 24 is an illustration of a wristwatch 2400 including a dynamic photodiode 2402, where dynamic photodiode 2402 is an embodiment of one of dynamic photodiodes 100, 900, 1600, 1900, 2000, or 2300. Wristwatch 2400 is configured to use dynamic photodiode 2402, for example, to sense heart rate, blood oxygen level, body temperature, and/or another physical characteristic of a user wearing wristwatch 2400. Dynamic photodiode 2402 is typically not visible from the outside of wristwatch 2400, and FIG. 24 accordingly symbolically shows dynamic photodiode 2402 by a box formed of dashed lines.

Figure 25:
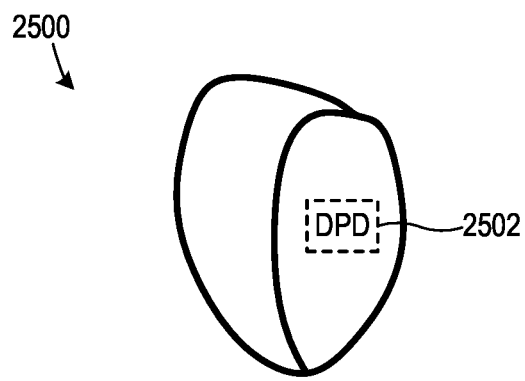
FIG. 25 is an illustration of a sensing device intended to be worn in an ear canal of a user, where the sensing device includes a dynamic photodiode, according to an embodiment.

As another example, FIG. 25 is an illustration of a sensing device 2500 intended to be worn in an car canal of a user. Sensing device 2500 includes a dynamic photodiode 2502, where dynamic photodiode 2502 is an embodiment of one of dynamic photodiodes 100, 900, 1600, 1900, 2000, or 2300. Sensing device 2500 is configured to use dynamic photodiode 2502, for example, to sense heart rate, blood oxygen level, body temperature, and/or another physical characteristic of a user wearing sensing device 2500. Dynamic photodiode 2502 is typically not visible from the outside of sensing device 2500, and FIG. 25 accordingly symbolically shows dynamic photodiode 2502 by a box formed of dashed lines.

Combinations of Features

Features described above may be combined in various ways without departing from the scope hereof. The following examples illustrate some possible combinations.

(A1) A canal dynamic photodiode includes (1) a gate structure forming a plurality of apertures, (2) at least one anode region within the gate structure, and (3) a plurality of cathode regions, each cathode region being within a respective aperture of the plurality of apertures.

(A2) In the canal dynamic photodiode denoted as (A1), the at least one anode region within the gate structure may include a plurality of anode regions within the gate structure.

(A3) Either of the canal dynamic photodiodes denoted as (A1) and (A2) may further include a plurality of field regions.

(A4) In the canal dynamic photodiode denoted as (A3), each cathode region of the plurality of cathode regions may be separated from the gate structure by a respective field region of the plurality of field regions.

(A5) Any one of the canal dynamic photodiodes denoted as (A1) through (A4) may further include a substrate ring at least partially surrounding the gate structure.

(A6) The canal dynamic photodiode denoted as (A5) may further include a field region, where the field region separates the substrate ring from the gate structure.

(A7) Any one of the canal dynamic photodiodes denoted as (A1) through (A5) may further include a semiconductor substrate, where each of the at least one anode region and the plurality of cathode regions is formed in the semiconductor substrate.

(A8) In the canal dynamic photodiode denoted as (A7), (1) a portion of the semiconductor substrate under the gate structure may have a first net concentration of a first type of dopant, and (2) a field region of the semiconductor substrate may include a doped surface region having a second net concentration of the first type of dopant, the second net concentration being greater than the first net concentration.

(A9) In the canal dynamic photodiode denoted as (A7), the first type of dopant may be selected from a group consisting of a P-type dopant and an N-type dopant.

(B1) A canal dynamic photodiode includes (1) a semiconductor substrate including at least one anode region and a plurality of cathode regions and (2) a gate structure forming a plurality of apertures. The gate structure is disposed on the semiconductor substrate in a first direction such that (1) each cathode region of the plurality of cathode regions is disposed within a respective aperture of the plurality of apertures, as seen when the canal dynamic photodiode is viewed in the first direction, and (2) the at least one anode region is disposed within the gate structure, as seen when the canal dynamic photodiode is viewed in the first direction.

(B2) In the canal dynamic photodiode denoted as (B1), the at least one anode region may include a plurality of anode regions.

(B3) In either one of the canal dynamic photodiodes denoted as (B1) and (B2), the semiconductor substrate may further include a plurality of field regions, where cathode region of the plurality of cathode regions is separated from the gate structure by a respective field region of the plurality of field regions, as seen when the canal dynamic photodiode is viewed in the first direction.

(B4) In any one of the canal dynamic photodiodes denoted as (B1) through (B3), (1) a portion of the semiconductor substrate under the gate structure may have a first net concentration of a first type of dopant, (2) the semiconductor substrate may further include a plurality of field regions, where each field region separates a respective cathode region of the plurality of cathode regions from the gate structure, and (3) each field region of the plurality of field regions may include a respective doped surface region having a second net concentration of the first type of dopant, where the second net concentration is greater than the first net concentration.

(B5) In the canal dynamic photodiode denoted as (B4), the first type of dopant may be selected from a group consisting of a P-type dopant and an N-type dopant.

(C1) A dynamic photodiode includes (1) a plurality of gate structures, (2) a plurality of anode regions, where each anode region of the plurality of anode regions is disposed within a respective one of the plurality of gate structures, and (3) a plurality of cathode regions, where each cathode region of the plurality of cathode regions is separated from each gate structure of the plurality of gate structures.

(C2) The dynamic photodiode denoted as (C1) may further include a field region separating each cathode region of the plurality of cathode regions from each gate structure of the plurality of gate structures.

(C3) Either one of the dynamic photodiodes denoted as (C1) and (C2) may further include a substrate ring at least partially surrounding each of (a) the plurality of gate structures and (b) the plurality of cathode regions.

(C4) Any one of the dynamic photodiodes denoted as (C1) through (C3) may further include a semiconductor substrate, where (1) each anode region of the plurality of anode regions and each cathode region of the plurality of cathode regions may be formed in the semiconductor substrate, (2) a portion of the semiconductor substrate under each gate structure of the plurality of gate structures may have a first net concentration of a first type of dopant, and (3) the semiconductor substrate may further include a field region separating the plurality of cathode regions from the plurality of gate structures, where the field region includes a doped surface region having a second net concentration of the first type of dopant, the second net concentration being greater than the first net concentration.

(C5) In the dynamic photodiode denoted as (C4), the first type of dopant may be selected from a group consisting of a P-type dopant and an N-type dopant.

Changes may be made in the above methods, devices, and systems without departing from the scope hereof. For example, the shapes of dynamic photodiodes 100, 900, 1600, 1900, and 2200, as well as the shapes of their constituent elements, may vary without depart from the scope hereof. For instance in one alternate embodiment of canal dynamic photodiode 100, apertures 122 formed by gate structure 110 are circular shaped. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A dynamic photodiode, comprising:
   a semiconductor substrate comprising a plurality of field regions;
   a gate structure forming a plurality of apertures and disposed on the semiconductor substrate surrounding at least one of the plurality of field regions;
   at least one doped anode region at least partially surrounded by the gate structure; and
   a plurality of doped cathode regions, each doped cathode region being within a respective aperture of the plurality of apertures.

2. The dynamic photodiode of claim 1, wherein the at least one doped anode region at least partially surrounded by the gate structure comprises a plurality of doped anode regions at least partially surrounded by the gate structure.

3. The dynamic photodiode of claim 1, further comprising a plurality of field regions.

4. The dynamic photodiode of claim 3, wherein each doped cathode region of the plurality of doped cathode regions is separated from the gate structure by a respective field region of the plurality of field regions.

5. The dynamic photodiode of claim 1, further comprising a substrate ring at least partially surrounding the gate structure.

6. The dynamic photodiode of claim 5, further comprising a field region, the field region separating the substrate ring from the gate structure.

7. The dynamic photodiode of claim 1, further comprising a semiconductor substrate, each of the at least one doped anode region and the plurality of doped cathode regions being formed in the semiconductor substrate.

8. The dynamic photodiode of claim 7, wherein:
   a portion of the semiconductor substrate under the gate structure has a first net concentration of a first type of dopant; and
   a field region of the semiconductor substrate includes a doped surface region having a second net concentration of the first type of dopant, the second net concentration being greater than the first net concentration.

9. The dynamic photodiode of claim 8, wherein the first type of dopant is selected from a group consisting of a P-type dopant and an N-type dopant.

10. A dynamic photodiode, comprising:
    a semiconductor substrate comprising at least one doped anode region, a plurality of doped cathode regions, and a plurality of field regions; and
    a gate structure forming a plurality of apertures, the gate structure being disposed on the semiconductor substrate surrounding at least one of the plurality of field regions such that:
       each cathode region of the plurality of doped cathode regions is disposed within a respective aperture of the plurality of apertures, and
       the at least one doped anode region is at least partially surrounded by the gate structure.

11. The dynamic photodiode of claim 10, wherein the at least one doped anode region comprises a plurality of doped anode regions.

12. The dynamic photodiode of claim 10, wherein the semiconductor substrate further includes a plurality of field regions, each doped cathode region of the plurality of cathode regions being separated from the gate structure by a respective field region of the plurality of field regions.

13. The dynamic photodiode of claim 10, wherein:
    a portion of the semiconductor substrate under the gate structure has a first net concentration of a first type of dopant;
    the semiconductor substrate further includes a plurality of field regions, each field region separating a respective doped cathode region of the plurality of doped cathode regions from the gate structure; and
    at least one field region of the plurality of field regions includes a respective doped surface region having a second net concentration of the first type of dopant, the second net concentration being greater than the first net concentration.

14. The dynamic photodiode of claim 13, wherein the first type of dopant is selected from a group consisting of a P-type dopant and an N-type dopant.

15. The dynamic photodiode of claim 10, wherein the semiconductor substrate further includes a substrate ring, the substrate ring at least partially surrounding the gate structure.

16. A dynamic photodiode, comprising:
- a semiconductor substrate comprising a plurality of field regions;
- a plurality of gate structures, each forming a plurality of apertures and disposed on the semiconductor substrate surrounding at least one of the plurality of field regions;
- a plurality of doped anode regions, each doped anode region of the plurality of doped anode regions being at least partially surrounded by a respective one of the plurality of gate structures; and
- a plurality of doped cathode regions, each doped cathode region of the plurality of doped cathode regions being separated from each gate structure of the plurality of gate structures by at least one of the plurality of field regions.

17. The dynamic photodiode of claim 16, further comprising a field region separating each doped cathode region of the plurality of doped cathode regions from each gate structure of the plurality of gate structures.

18. The dynamic photodiode of claim 16, further comprising a substrate ring at least partially surrounding each of (a) the plurality of gate structures and (b) the plurality of cathode regions.

19. The dynamic photodiode of claim 16, further comprising a semiconductor substrate, wherein:
- each doped anode region of the plurality of doped anode regions and each doped cathode region of the plurality of doped cathode regions is formed in the semiconductor substrate;
- a portion of the semiconductor substrate under each gate structure of the plurality of gate structures has a first net concentration of a first type of dopant; and
- the semiconductor substrate further includes a field region separating the plurality of cathode regions from the plurality of gate structures, the field region including a doped surface region having a second net concentration of the first type of dopant, the second net concentration being greater than the first net concentration.

20. The dynamic photodiode of claim 19, wherein the first type of dopant is selected from a group consisting of a P-type dopant and an N-type dopant.

* * * * *